United States Patent
Yamaji et al.

(10) Patent No.: US 7,379,009 B2
(45) Date of Patent: May 27, 2008

(54) AD CONVERTER AND RADIO RECEIVER

(75) Inventors: Takafumi Yamaji, Yokohama (JP); Takeshi Ueno, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/623,803

(22) Filed: Jan. 17, 2007

(65) Prior Publication Data
US 2007/0194971 A1    Aug. 23, 2007

(30) Foreign Application Priority Data
Feb. 23, 2006  (JP)  ............... 2006-047125
Jul. 27, 2006  (JP)  ............... 2006-204140

(51) Int. Cl.
  *H03M 1/12*  (2006.01)
(52) U.S. Cl. .................... 341/155; 341/156
(58) Field of Classification Search ............. 341/155, 341/156, 161, 162
  See application file for complete search history.

(56) References Cited
U.S. PATENT DOCUMENTS
6,031,480 A    2/2000  Soenen et al.
6,753,801 B2   6/2004  Rossi
7,286,074 B2 * 10/2007 Kudoh et al. ............... 341/162
2005/0219101 A1 10/2005 Kurose et al.
2007/0024359 A1  2/2007 Yamaji et al.
2007/0026835 A1  2/2007 Yamaji et al.

* cited by examiner

*Primary Examiner*—Rexford Barnie
*Assistant Examiner*—Joseph Lauture
(74) *Attorney, Agent, or Firm*—Amin, Turocy & Calvin, LLP

(57) ABSTRACT

Disclosed is an AD converter including: a first conversion stage including a quantizing part to generate m parallel pieces of quantized signals from m pieces of input analog signals representing n-dimensional vectors (n<m<2n), a decoding part to generate m pieces of decoded analog signals from the m parallel pieces of quantized signals, and a residual amplifying part to output m pieces of amplified residual signals by multiplying respective differences between each of the m pieces of analog signals and each of the m pieces of decoded analog signals; a second conversion stage including a quantizing part to generate m parallel pieces of quantized signals from the m pieces of amplified residual signals; and a synthesizing part to generate m parallel pieces of digital signals by synthesizing each of the quantized signals in the first conversion stage and in the second conversion stage at each parallel position.

19 Claims, 13 Drawing Sheets

[FOR THREE SIGNALS]

AD CONVERTER AND RADIO RECEIVER

CROSS REFERENCE TO RELATED APPLICATIONS

This application is based upon and claims the benefit of priority from the prior Japanese Patent Applications No. 2006-47125, filed on Feb. 23, 2006 and No. 2006-204140 filed on Jul. 27, 2006; the entire contents of which are incorporated herein by reference.

BACKGROUND OF THE INVENTION

1. Field of the Invention

The present invention relates to an AD converter AD-converting vector analog signals (a set of analog signals), and to a radio receiver including the same.

2. Description of the Related Art

In a radio communication field as of 2005, many methods are adopted that modulate both amplitude and phase with a signal. For this purpose, two orthogonal signals called an in-phase signal (referred to as an I signal) and a quadrature-phase signal (referred to as a Q signal) are used in many cases.

Around 1995, for example, to form a filter on an integrated circuit, a single-ended method (a method in a circuit handling a voltage between a signal line and a ground line as a signal) was sometimes adopted for both of the I-signal and the Q signal. From 2000 onward, a differential method (a method in a circuit handling a voltage between a plus signal line and a minus signal line as a signal) has been often adopted for both of the I-signal and the Q-signal. An advantage of the single-ended method is that the single-ended method requires less number of components compared with the differential method. In a communication method in 1990s, since a transfer rate was low and large capacitors were required, some of the capacitors were mounted on a circuit board as external components to/from the integrated circuit. To reduce cost, the number of external components needs to be reduced as much as possible, and thus the single-ended method is more preferable.

In the single-ended method, however, it is necessary to supply amplifying circuits in the integrated circuit with an analog ground potential, in addition to a power supply voltage and a ground potential, as an analog reference voltage. In this case, since a signal current flows to the analog ground potential, a buffer amplifier for analog ground with a high current supply (or current absorbing) capability has to be used. If output impedance of the buffer amplifier for analog ground is high, the analog ground potential varies due to the signal current. This variation is a cause of, for example, signal leakage from the I-signal to the Q-signal, or a cause of signal leakage from an output to an input. The latter signal leakage causes a problem of the oscillation of the circuit.

From 2000 onward, in a radio communication method, a band range has become wider for higher-speed data transfer and relatively small-capacitance capacitors have come in use. It has become possible to integrate most components on a chip, which has promoted more use of the differential method. In the differential method, voltages equal in magnitude and reverse in polarity are supplied to a plus terminal and a minus terminal respectively for amplification or the like. An average value of the voltages of the plus terminal and the minus terminal virtually serves as an analog ground potential, but there is no need to provide an analog ground terminal because a current outputted from the plus terminal flows to the minus terminal. Not requiring the buffer amplifier for analog ground that is necessary in the single-ended method, the differential method requires less power consumption.

At present, the differential method is adopted in most cases. To convert an analog signal to a digital signal, a differential amplifying circuit is also often used as described in the specifications of U.S. Pat. No. 6,031,480 and U.S. Pat. No. 6,753,801.

However, as cost per area of a semiconductor chip increases in accordance with the progress of microfabrication technology, analog circuits, especially, passive elements have come to occupy a large ratio in chip area, that is, in chip cost. Therefore, to reduce cost, a reduction in area of the passive elements is an important issue.

The single-ended method is advantageous in reducing chip area and cost because the single-ended method requires a less number of components, but has a problem of increased power consumption because the single-ended method requires the buffer amplifier with a high current driving capability in order to supply the analog ground potential to circuit blocks. To solve this problem, the inventors have tried to devise an analog 3-phase signal processing circuit having an amplifier, a filter, and a frequency converter circuit.

Similarly, for an analog-digital (AD) converter, a method not requiring an analog ground potential with a high current driving capability and capable of reducing cost is necessary.

[Related Art 1] U.S. Pat. No. 6,031,480
[Related Art 2] U.S. Pat. No. 6,753,801

BRIEF SUMMARY OF THE INVENTION

An AD converter according to one aspect of the present invention includes: a first conversion stage including a first quantizing part that quantizes each of m pieces of analog signals representing n-dimensional vectors (n<m<2n) to generate m parallel pieces of first quantized signals, a first decoding part that decodes them parallel pieces of first quantized signals to generate m pieces of first decoded analog signals, and a first residual amplifying part that multiplies respective differences between the m pieces of analog signals and the m pieces of first decoded analog signals by a constant multiplier to output m pieces of amplified residual signals; a second conversion stage including a second quantizing part that quantizes each of the m pieces of amplified residual signals to generate m parallel pieces of second quantized signals; and a synthesizing part that synthesizes each of the first quantized signals and each of the second quantized signals at each parallel position after delaying the first quantized signals by a delay amount of the second quantized signals relative to the first quantized signals, to generate m parallel pieces of digital signals.

Since inputs of this AD converter are the m pieces of analog signals representing the n-dimensional vectors (n<m<2n), the number of the inputs is reduced (m<2n) compared with a case where the n-dimensional vectors are handled as differential signals of respective components thereof (the number of inputs is 2n). Accordingly, it is possible to decrease the number of elements necessary in an AD converter circuit, especially, the number of passive elements occupying a large ratio in chip area, which realizes cost reduction. Further, since the m pieces of analog signals represent the n-dimensional vectors and include differential signals respectively, a buffer amplifier with a high current driving capability is not necessary to supply an analog ground potential to circuit blocks. This results in power saving. This AD converter converts the m pieces of analog signals to a predetermined digital form by so-called pipeline processing, thereby generating the m parallel pieces of digital signals.

An AD converter according to another aspect of the present invention includes: a first conversion stage including a first quantizing part that quantizes each of m pieces of analog signals representing n-dimensional vectors (n<m<2n) to generate m parallel pieces of first quantized signals, a first decoding part that decodes the m parallel pieces of first quantized signals to generate m pieces of first decoded analog signals, and a first residual amplifying part that multiplies respective differences between the m pieces of analog signals and the m pieces of first decoded analog signals by a constant multiplier to output m pieces of first amplified residual signals; a second conversion stage including a second quantizing part that quantizes each of the m pieces of first amplified residual signals to generate m parallel pieces of second quantized signals; a second decoding part that decodes the m parallel pieces of second quantized signals to generate m pieces of second decoded analog signals, and a second residual amplifying part that multiplies respective differences between the m pieces of first amplified residual signals and the m pieces of second decoded analog signals by a constant multiplier to output m pieces of second amplified residual signals; a switch that guides the m pieces of second amplified residual signals instead of the m pieces of analog signals to the first conversion stage; and a synthesizing part that synthesizes each of the first quantized signals and each of the second quantized signals at each parallel position after delaying the first quantized signals by a delay amount of the second quantized signals relative to the first quantized signals, to generate m parallel pieces of digital signals.

Since inputs of this AD converter are the m pieces of analog signals representing the n-dimensional vectors (n<m<2n), the number of the inputs is reduced (m<2n) compared with a case where the n-dimensional vectors are handled as differential signals of respective components thereof (the number of inputs is 2n). Accordingly, it is possible to decrease the number of elements necessary in an AD converter circuit, especially, the number of passive elements occupying a large ratio in chip area, which realizes cost reduction. Further, since the m pieces of analog signals represent the n-dimensional vectors and include differential signals respectively, a buffer amplifier with a high current driving capability is not necessary to supply an analog ground potential to circuit blocks. This results in power saving. This AD converter converts the m pieces of analog signals to a predetermined digital form by so-called cyclic processing, thereby generating the m parallel pieces of digital signals.

An AD converter according to still another aspect of the present invention converts m pieces of analog signals representing n-dimensional vectors (n<m<2n) to m parallel pieces of K-bit digital signals, and includes: a decoding part that decodes m parallel pieces of K-bit digital values in each piece of which bits up to a $k^{th}$ bit ($0 \leq k \leq K-1$) have been decided and a $(k+1)^{th}$ bit and thereafter are given tentative values, to generate m pieces of decoded analog signals; a quantizing part that generates m parallel pieces of 1-bit quantized signals by comparing each of the m pieces of analog signals and each of the m pieces of decoded analog signals; a first control part that decides a $(k+1)^{th}$ bit of each of m parallel pieces of K-bit digital codes based on each of values of the m parallel pieces of 1-bit quantized signals, to output m parallel pieces of K-bit digital values in each piece of which bits up to a $(k+1)^{th}$ bit have been decided and a $(k+2)^{th}$ bit and thereafter are given tentative values; and a second control part that causes the decoding part, the quantizing part, and the first control part to operate in respective states where the "k" is changed from 0 to K−1, and outputs m parallel pieces of K-bit digital values in each piece of which bits up to a $K^{th}$ bit have been decided, as the m parallel pieces of K-bit digital signals.

Since inputs of this AD converter are the m pieces of analog signals representing the n-dimensional vectors (n<m<2n), the number of the inputs is reduced (m<2n) compared with a case where the n-dimensional vectors are handled as differential signals of respective components thereof (the number of inputs is 2n). Accordingly, it is possible to decrease the number of elements necessary in an AD converter circuit, especially, the number of passive elements occupying a large ratio in chip area, which realizes cost reduction. Further, since the m pieces of analog signals represent the n-dimensional vectors and include differential signals respectively, a buffer amplifier with a high current driving capability is not necessary to supply an analog ground potential to circuit blocks. This results in power saving. This AD converter converts the m pieces of analog signals to a predetermined digital form by so-called successive approximation processing, thereby generating the m parallel pieces of digital signals.

An AD converter according to yet another (fourth) aspect of the present converts m pieces of analog signals representing n-dimensional vectors (n<m<2n) to m parallel pieces of digital signals, and includes: a decoding part that decodes each of the m parallel pieces of digital signals to generate m pieces of decoded analog signals; a linear conversion part that linearly converts respective differences between each of the m pieces of analog signals and each of the m pieces of decoded analog signals to output m pieces of linearly converted analog signals; and a quantizing part that quantizes each of the m pieces of linearly converted analog signals to generate m parallel pieces of 1-bit quantized signals as the m parallel pieces of digital signals.

Since inputs of this AD converter are the m pieces of analog signals representing the n-dimensional vectors (n<m<2n), the number of the inputs is reduced (m<2n) compared with a case where the n-dimensional vectors are handled as differential signals of respective components thereof (the number of input is 2n). Accordingly, it is possible to decrease the number of elements necessary in the AD converter circuit, especially, the number of passive elements occupying a large ratio in chip area, which realizes cost reduction. Further, since the m pieces of analog signals represent the n-dimensional vectors and include differential signals respectively, a buffer amplifier with a high current driving capability is not necessary to supply an analog ground potential to circuit blocks. This results in power saving. This AD converter converts the m pieces of analog signals to a predetermined digital form by so-called delta-sigma processing, thereby generating the m parallel pieces of digital signals.

DETAILED DESCRIPTION OF THE INVENTION

Description of Embodiments

Figure 1:
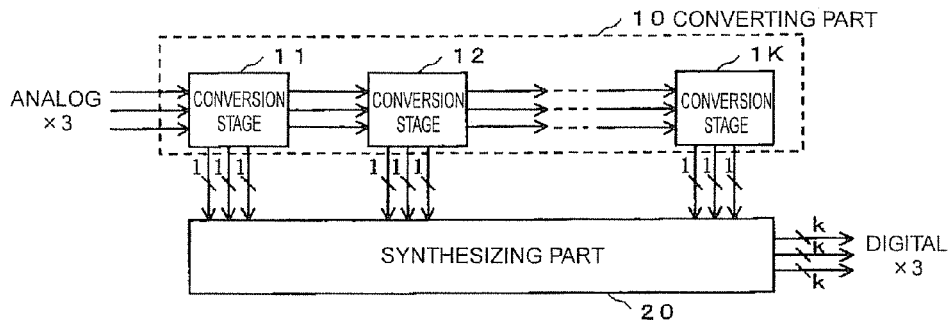
FIG. 1 is a block diagram showing the configuration of an AD converter according to one embodiment.

Embodiments of the present invention will be described with reference to the drawings, but these drawings are provided only for an illustrative purpose and in no way limit the present invention.

A possible form in one aspect and another aspect mentioned above is such that the n is 2, the m is 3, each of three parallel first quantized signals and three parallel second quantized signals generated by the first and second quantizing parts of the first and second conversion stages consists of 1-bit, and the constant multiplier of the first residual amplifying part is substantially two. In this case, three analog signals representing two-dimensional vectors (for example, consisting of an I(t) component and a Q(t) component) are input signals. The three analog signals may be, for example, signals of $(I/2, -I/4-\sqrt{3}\cdot Q/4, -\frac{1}{4}+\sqrt{3}\cdot Q/4)$. Further, since each of the three parallel quantized signals consists of 1-bit information, the construction of the quantizing part is most simplified. The constant multiplier of the residual amplifying part is substantially two because each of the three parallel quantized signals generated by the quantizing part consists of 1-bit information.

A possible form here is such that each of the first and second conversion stages is configured so as to generate three parallel 1-bit quantized signals in each of the first and second quantizing parts by comparing each of three analog signals with a reference voltage, and so as to generate each of the reference voltages in the first and second quantizing parts substantially by averaging the three analog signals.

In this case, each of the quantizing parts performs the 1-bit quantization based on the comparison with the reference voltage, and each of the reference voltages in the first and second quantizing parts is generated by the averaging of three analog signals. This is because, if the three analog signals are signals of, for example, $(I/2, -I/4-\sqrt{3}\cdot Q/4, -\frac{1}{4}+\sqrt{3}\cdot Q/4)$, an average signal is $((I/2) +(-I/4-\sqrt{3}\cdot Q/4)+(-\frac{1}{4}+\sqrt{3}\cdot Q/4))/3=0$ (an origin of an IQ plane), which is a preferable value as the reference voltage for the 1-bit quantization. The use of such an average signal as the reference voltage enables quantization free from the influence of common mode noise even when the common mode noise is superimposed on the three analog signals.

Another possible form here is such that in the first and second conversion stages, each of the first and second quantizing parts generates three parallel 1-bit quantized signals by comparing analog signals in each of three different pairs each consisting of two of three analog signals. An advantage in this case is that the generation of the reference voltage is not necessary, and the connection structure of the quantizing part and the decoding part becomes simpler.

Another possible form here is such that the first decoding part and the first residual amplifying part in the first conversion stage are constituted by three MDACs (Multiplying D-to-A Converters), and the first residual amplifying part being part of each of the three MDACs has a 3-input 3-output operational amplifying circuit common to the three MDACs and having a common mode rejection function. In this case, even if a common mode component is superimposed on three input signals of the 3-input 3-output operational amplifying circuit, the common mode component becomes very small on an output side, which is preferable. This can allow some degree of inclusion of the common mode component in the three input signals, which can realize, for example, simplification of the entire MDACs in its structure.

Here, another possible form is such that, when the three parallel first 1-bit quantized signals all have equal values, the first decoding part of the first conversion stage generates three signals each having a value between analog values each corresponding to respective binaries of the first 1-bit quantized signals, as the three first decoded analog signals. This is a design to prevent the three decoded analog signals from having a large common mode component in a case where the three parallel 1-bit quantized signals all have the same value.

Here, another possible form is such that the first decoding part of the first conversion stage generates, as the three first decoded analog signals, three analog signals from which a common mode component is removed. This permits the residual amplifying part to have the structure with an ordinary 1-input 1-output operational amplifier.

A possible form in still another aspect mentioned above is such that the n is 2 and the m is 3. In this case, three analog signals representing two-dimensional vectors (for example, consisting of an I(t) component and a Q(t) component) are input signals. The three analog signals can be signals of, for example, (I/2, $-I/4 - \sqrt{3} \cdot Q/4$, $-\frac{1}{4}+\sqrt{3}\cdot Q/4$) respectively.

Another possible form is such that, when values of the m parallel pieces of 1-bit quantized signals are all equal, the first control part further outputs, as the m parallel pieces of K-bit digital signals, the m parallel pieces of K-bit codes in each of which bits up to a $k^{th}$ bit have been decided and the $(k+1)^{th}$ bit and thereafter are given tentative values. In a case where all the values of the m parallel pieces of 1-bit quantized signals become equal (all are 0 or all are 1), it can be said that the m parallel pieces of K-bit codes including a portion of the bits given the tentative values are equal to the m pieces of analog signals respectively. Therefore, in this case, it is possible to obtain the AD conversion result without any further successive approximation.

Another possible form in still another aspect (fourth aspect) mentioned above is such that the n is 2 and the m is 3. In this case, three analog signals representing two-dimensional vectors (consisting of, for example, an I(t) component and a Q(t) component) are input signals. The three analog signals may be signals of, for example (I/2, $-I/4-\sqrt{3}\cdot Q/4$, $-\frac{1}{4}+\sqrt{3}\cdot Q/4$).

A possible form here is such that the linear conversion part includes a 3-input 3-output operational amplifying circuit that has a common mode rejection function and is commonly used to linearly convert the respective differences between each of three analog signals and each of three decoded analog signals. In this case, even when a common mode component is superimposed on three input signals of the 3-input 3-output operational amplifying circuit, the common mode component becomes very small on an output side, which is preferable.

Here, another possible form is such that the quantizing part is configured so as to generate three parallel 1-bit quantized signals by comparing each of three linearly converted analog signals and a reference voltage, and so as to generate the reference voltage therein substantially by averaging the three linearly converted analog signals.

In this case, the quantizing part performs the 1-bit quantization based on the comparison with the reference voltage, and the reference voltage is generated by the averaging of the three linearly converted analog signals. This is because, if the three linearly converted analog signals are signals of, for example, (I/2, $-I/4-0.3\cdot Q/4$, $-\frac{1}{4}+0.3\cdot Q/4$), an average signal is $((I/2)+(-I/4-\sqrt{3}\cdot Q/4)+(-\frac{1}{4}+0.3\cdot Q/4))/3=0$ (an origin of an IQ plane), which is a preferable value as the reference voltage for the 1-bit quantization. The use of such an average signal as the reference voltage enables quantization free from the influence of common mode noise even when the common noise is superimposed on the three linearly converted analog signals.

Here, another possible form is such that the quantizing part generates three parallel 1-bit quantized signals by comparing linearly converted analog signals in each of three different pairs each consisting of two of three linearly converted analog signals. This has an advantage that the generation of the reference voltage is not required and the construction of the decoding part can be more simplified.

Based on the above, hereinafter, embodiments will be described with reference to the drawings. FIG. 1 shows the configuration of an AD converter according to one embodiment. As shown in FIG. 1, this AD converter includes a converting part 10 and a synthesizing part 20. The converting part 10 is composed of the cascade connection of conversion stages 11, 12, ..., 1K.

The converting part 10 receives three analog signals. The conversion stages 11, 12, ... 1K quantizes each of the analog signals to 1-bit information. Each of the conversion stages 11, 12, ..., 1K, outputs analog residuals after the quantization as three analog signals to a subsequent conversion stage. The synthesizing part 20 synthesizes quantized signals at each parallel position in sets of the three parallel quantized signals generated in the conversion stage 11, 12, ..., 1K, taking a delay amount depending on each cascade connection position of the relevant conversion stage into account, thereby generating three digital signals. The converting part 10 and the synthesizing part 20 constitute a so-called pipeline AD converter. But, it is a unique feature that three analog signals are inputted and three digital signals are accordingly outputted.

In this AD converter, residuals are amplified in the conversion stages 11, 12, ..., 1K, so that the quantization in a conversion stage on a later stage is more precise. Further, since the amplified signals are transmitted, the influence of internal noise in the conversion stages 11, 12, ..., 1K is larger on earlier stages and is smaller on later stages. These characteristics are the same as the characteristics of a typical pipeline AD converter.

Here, the three analog signals to be inputted to this AD converter will be further described. These analog signals are signals representing two-dimensional vectors on a phase plane. Therefore, two independent signals will suffice, but in view of an advantage in signal processing and the like, three input signals are intentionally used. If the phase plane is an IQ plane, three analog signals v0T, v1T, v2T correspond to respective signals of, for example, (I/2, $-I/4-0.3\cdot Q/4$, $-\frac{1}{4}+0.3\cdot Q/4$). The three analog signals v0T, v1T, v2T have a common mode component (v0T+v1T+v2T)/3=vm and three differential components v0T−vm, v1T−vm, v2T−vm. Here, the sum of the three differential components is naturally 0 (zero) from the definition. If the common mode component vm is 0, the three analog signals v0T, v1T, v2T match the respective signals of (I/2, $-I/4-\sqrt{3}\cdot Q/4$, $-\frac{1}{4}+\sqrt{3}\cdot Q/4$).

Figure 2:
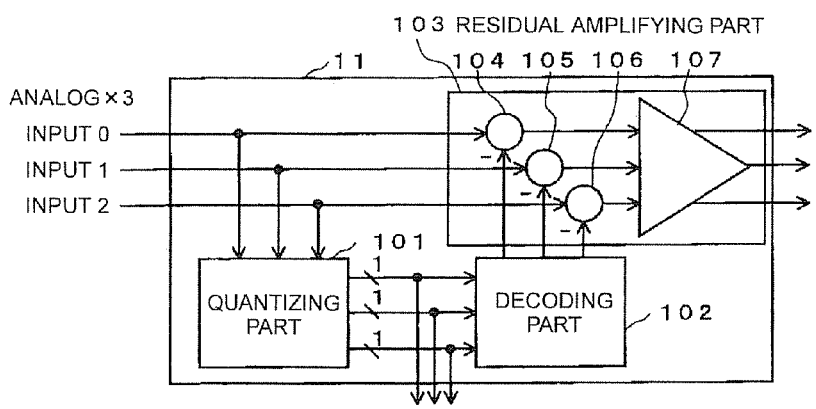
FIG. 2 is a block diagram showing an example of the internal configuration of a conversion stage shown in FIG. 1.

FIG. 2 shows an example of the internal configuration of the conversion stages 11, 12, ..., 1K shown in FIG. 1. As shown in FIG. 2, the conversion stage 11 has a quantizing part 101, a decoding part 102, and a residual amplifying part 103 (the other conversion stages have the same configuration, but the conversion stage 1K need not have the decoding part 102 and the residual amplifying part 103).

The quantizing part 101 quantizes each of the three inputted analog signals to 1-bit information, and outputs the 1-bit informations as three parallel quantized signals. The decoding part 102 decodes the three parallel quantized signals to generate three decoded analog signals. The residual amplifying part 103 multiplies respective differences between each of the aforesaid three analog signals and each of the three decoded analog signals by two to output three amplified residual signals. For this purpose, the residual amplifying part 103 has subtractors 104, 105, 106 and a 3-input 3-output operational amplifying circuit 107. The 3-input 3-output operational amplifying circuit has little gain for a common component and a high gain for a differential component (to be described later).

Figure 3:
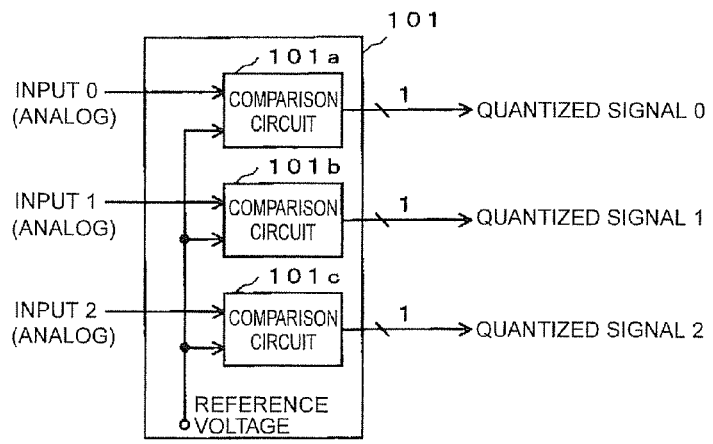
FIG. 3 is a block diagram showing an example of the internal configuration of a quantizing part shown in FIG. 2.

FIG. 3 shows an example of the internal configuration of the quantizing part 101 shown in FIG. 2. As shown in FIG. 3, the quantizing part 101 has three comparison circuits 101a, 101b, 101c provided in parallel. The three analog signals are supplied as inputs of the comparison circuits 101a, 101b, 101c respectively, and a reference voltage is applied as the other inputs (reference input) of the comparison circuits 101a, 101b, 101c. According to magnitude relations of the three analog signals and the reference voltage, 1-bit quantized signals are obtained in outputs of the comparison circuits 101a, 101b, 101c. The reference voltage is generated in advance as a voltage corresponding to a common mode component of the three analog signals inputted to the quantizing part 101.

Figure 4:
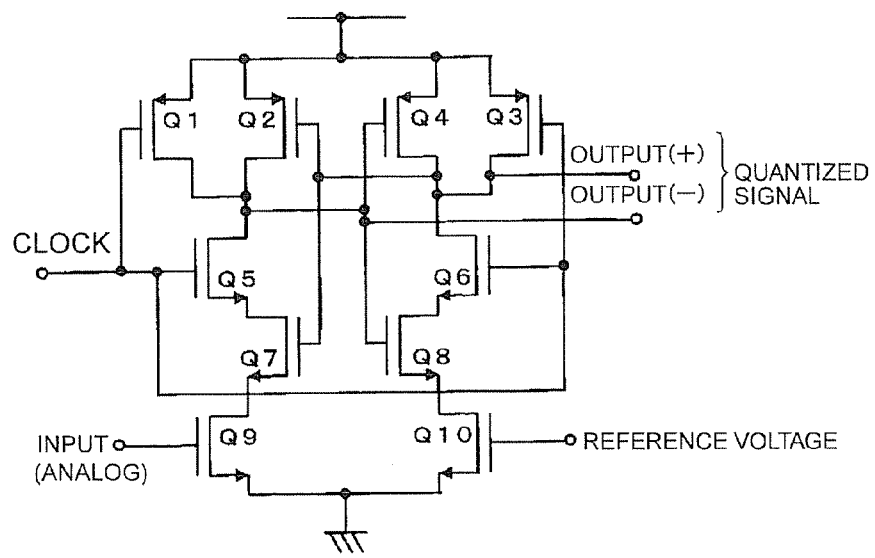
FIG. 4 is a circuit diagram showing a concrete example of a comparison circuit shown in FIG. 3.

FIG. 4 shows a concrete example of the comparison circuit 101a (101b, 101c) shown in FIG. 3. In this example, the comparison circuit 101a (101b, 101c) is constituted of FETs (field effect transistors) Q1 to Q10. Incidentally, an input terminal of a clock in FIG. 4 is a clock input terminal through which the timing for outputting the quantized signal is given.

Figure 5:
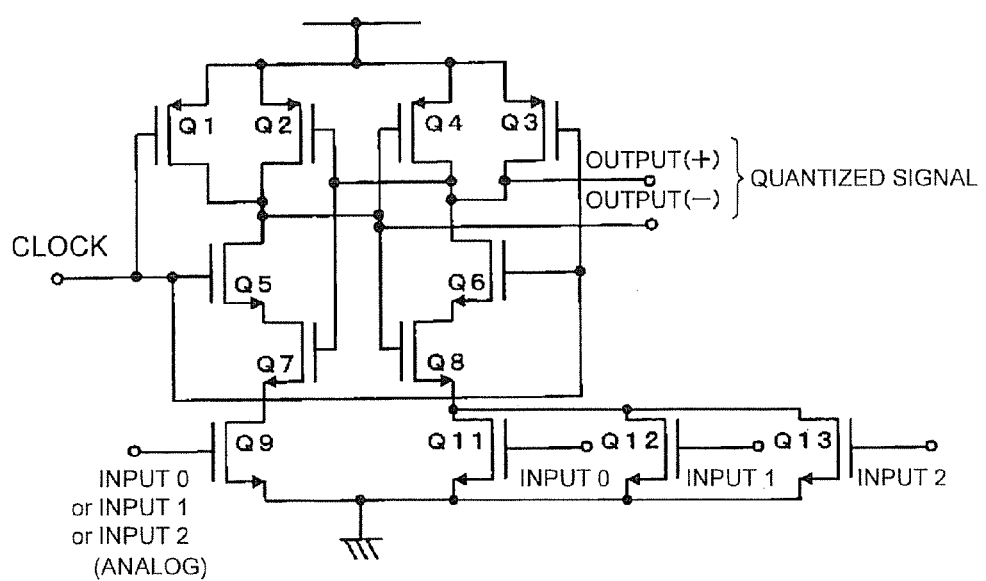
FIG. 5 is a circuit diagram showing another concrete example of the comparison circuit shown in FIG. 3.

FIG. 5 shows another concrete example of the comparison circuit 101a (101b, 101c) shown in FIG. 3. In this example, the three analog signals inputted to the quantizing part 101 are used to generate the reference voltage. As shown in FIG. 5, the comparison circuit 101a (101b, 101c) includes FETs Q11, Q12, Q13 and the three analog signals are supplied to gates of the FETs Q11, Q12, Q13 respectively. By this structure, an average value of the three analog signals (that is, the common mode component thereof) equivalently becomes the reference voltage. Therefore, even when common mode noise is superimposed on the three analog signals (for example, variation in power supply voltage), the quantization can be less susceptible to the noise.

Figure 6:
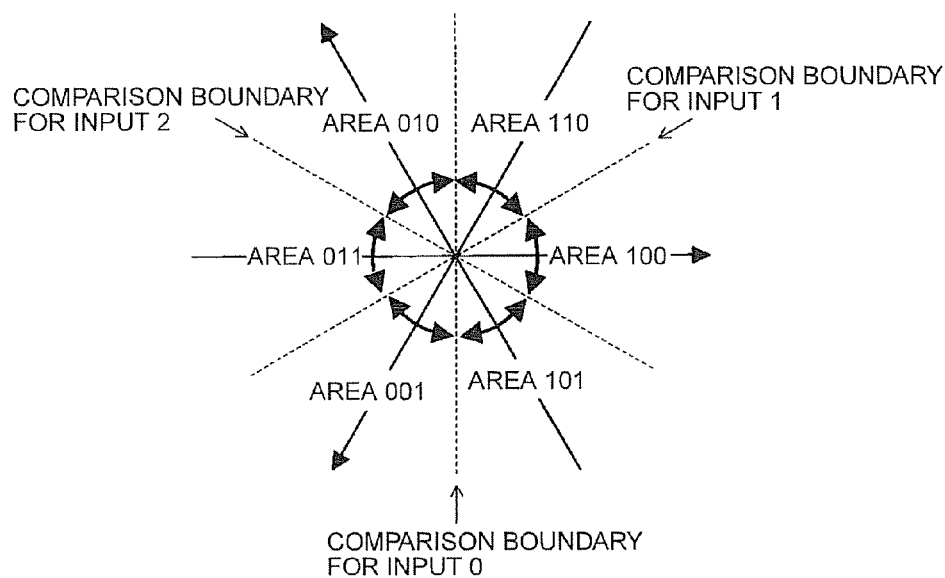
FIG. 6 is a phase plane view for explaining the operation of the quantizing part shown in FIG. 3 (ideal case).

FIG. 6 shows a phase plane for explaining the operation of the quantizing part 101 shown in FIG. 3 (ideal case). As previously described, the three analog signals include the common mode component corresponding to the average thereof and three differential components corresponding to the respective differences between the common mode component and each of signal voltages of the analog signals. Therefore, the sum of the differential components of the three analog signals is 0. Under the condition where the sum becomes 0, the degree of freedom of the three analog signals is 2, so that 1-to-1 correspondence to vectors on the phase plane (IQ plane) is possible.

If the quantizing part 101 shown in FIG. 3 were free from error, the input analog signals would be converted to binary codes shown in FIG. 6 respectively according to six areas segmented by the broken lines shown in FIG. 6. No area corresponding to a code "000" or a code "111" would exist. However, the actual comparison circuits 101a etc. have offsets, and the reference voltage generated in advance does not always match a common mode component voltage of the three analog signals.

Figure 7:
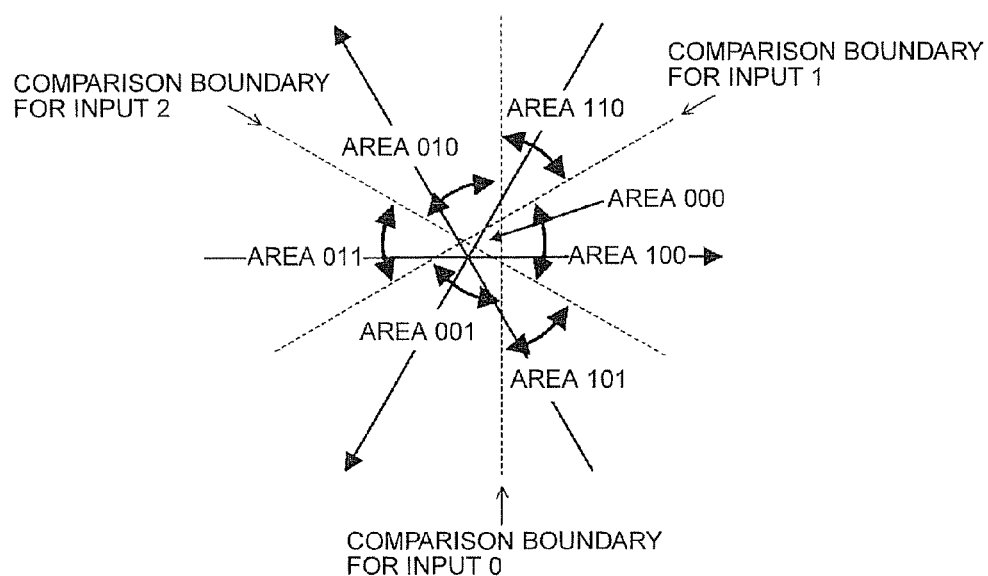
FIG. 7 is a phase plane view for explaining the operation of the quantizing part shown in FIG. 3 (actual case).

Therefore, actually, the positions of the broken lines deviate from the ideal places as shown in FIG. 7. Outputs of the comparison circuits 101a, 101b, 101c become "000" in an area close to the center surrounded by the broken lines in FIG. 7. Depending on how the broken lines deviate, the outputs sometimes become "111" in the area close to the center. Taking these errors into consideration, the quantizing part 101 can be regarded as a quantizer that quantizes signals to seven points shown in FIG. 8. The center point corresponds to "000" or "111".

Figure 9:
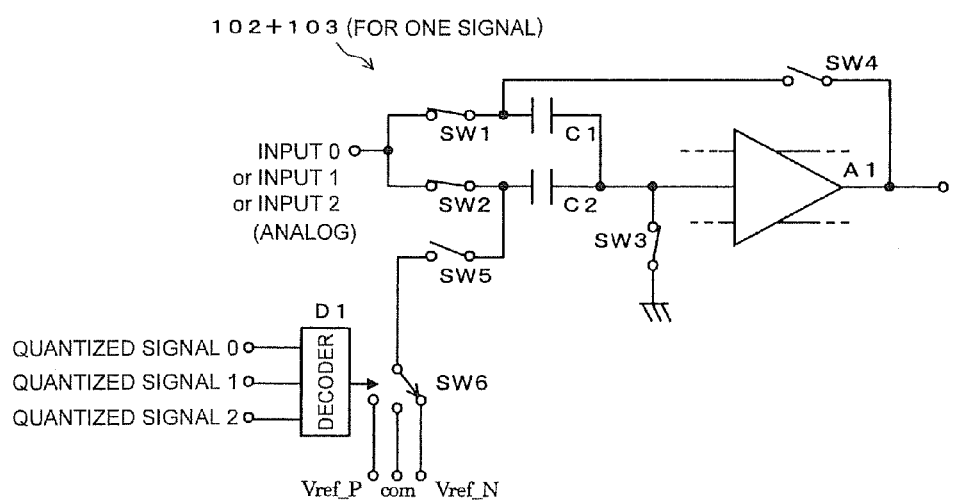
FIG. 9 is a circuit diagram showing a concrete example of a decoding part and a residual amplifying part shown in FIG. 2.

FIG. 9 shows a concrete example of the decoding part 102 and the residual amplifying part 103 shown in FIG. 2. To simplify the description, a circuit for only one signal is shown. This circuit as a whole is a circuit called a MDAC (Multiplying D-to-A Converter). A 3-input 3-output operational amplifying circuit A1 shown in FIG. 9 has a common mode rejection function so that it has a high gain for a differential component and has a low gain for a common mode component (corresponding to the 3-input 3-output operational amplifying circuit 107 in FIG. 2).

Further, a decoder D1 especially detects that the three parallel 1-bit quantized signals are "000" and "111" (that is, detects a case where the three analog signals correspond to the center point on the phase plane). When this is detected, the position of a switch SW6 is changed to "com". In a case of the other codes, the position of the switch SW6 is changed to Vref_P or Vref_N according to high/low of the quantized signal corresponding to the inputted analog signal. The "com" is an intermediate voltage between Vref_P and Vref_N. The function of the decoding part 102 is realized by the decoder D1, the switch SW6, and the three reference voltages com, Vref_P, Vref_N.

This MDAC has the same configuration as that of a single-ended or differential MDAC except in the above-described characteristic of the 3-input 3-output operational amplifying circuit A1 and in the existence of the decoder D1. As an example, a case where the three parallel 1-bit quantized signals are "001" and "101" will be discussed. In the case of "001", the positions of the three switches SW6 (three including SW6 in circuits for the other two signals) are changed to Vref_N, Vref_N, and Vref_P respectively. If Vref_P−Vref_N is 1 V, decoded analog signals after the common mode component is removed (that is, equivalent to outputs of the 3-input 3-output operational amplifier A1) are (−1/3, −1/3, 2/3) respectively.

In the case of "101", the connection positions of the three switches SW6 are Vref_P, Vref_N, and Vref_P respectively, and the decoded analog signals after the common mode component is removed (that is, equivalent to outputs of the 3-input 3-output operational amplifying circuit A1) are (1/3, −2/3, 1/3) respectively. These decoded analog signals are subtracted from the input analog signals respectively, and the subtraction results are amplified twofold in the 3-input 3-output operational amplifying circuit A1 to be outputted therefrom.

The operation as the MDAC will be further described below. In a state where SW1, SW2, and SW3 are closed and SW4 and SW5 are opened as shown in FIG. 9, capacitors C1, C2 equal in capacitance are charged with voltages according to the input analog signal. Next, on the contrary, when this state changes to a state where SW1, SW2, and SW3 are opened and SW4 and SW5 are closed, a current flows to one of Vref_P, Vref_N, and com from the output of the 3-input 3-output operational amplifying circuit A1 via SW4, C1, C2, SW5, SW6 so that an input node of the 3-input 3-output operational amplifying circuit A1 has 0 V.

For easier understanding, supposing that the current flows to com which is 0 V, a potential of the input node of the 3-input 3-output operational amplifying circuit A1 decreases at first to a minus potential by an amount corresponding to the charged voltage of the capacitor C2, and a current flows so that this potential is recovered to zero volt by the aforesaid current, so that a charged amount of C1 becomes twice as large as the original charged amount. Consequently, a voltage twice as high as a voltage of the input analog signal occurs at the output of the 3-input 3-output operational amplifying circuit A1. Actual operations including the subtraction can be similarly accounted for, by taking actual voltages of Vref_P, Vref_N, con into account.

Figure 10:
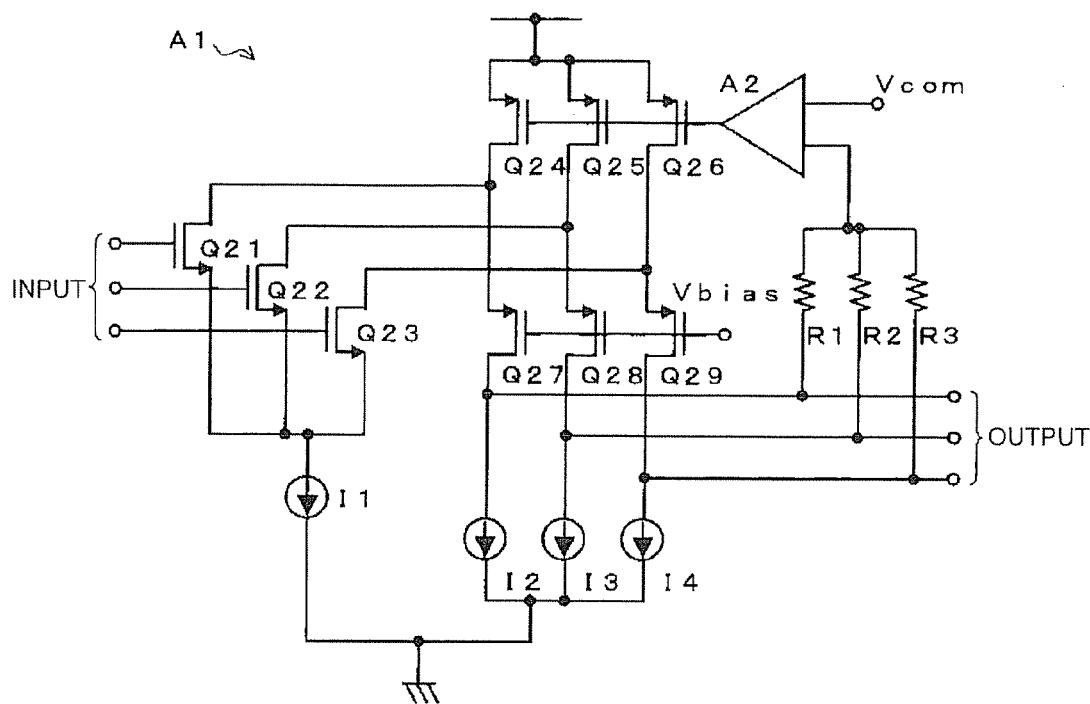
FIG. 10 is a circuit diagram showing a concrete example of a 3-input 3-output operational amplifying circuit shown in FIG. 9.

FIG. 10 shows a concrete example of the 3-input 3-output operational amplifying circuit A1 shown in FIG. 9. In this example, the 3-input 3-output operational amplifying circuit A1 includes FETs Q21 to Q29, constant current sources I1 to I4, resistors R1 to R3, and an operational amplifying circuit A2. This circuit is basically a so-called folded cascode amplifier. The amplifier of this type is advantageous in its wide tolerance to input of a common mode component.

The resistors R1 to R3 and the operational amplifying circuit A2 constitute a common mode component feedback circuit, which controls gate voltages of FETs Q24, Q25, Q26 of a current source circuit so that the common mode component on an output side becomes equal to a common mode component reference voltage Vcom. The common mode component on the output side can be generated as a voltage of a common node of the star connection of the resistors R1 to R3 equal in value whose one-side ends are connected to the output of the amplifier, as shown in FIG. 10.

Figure 11:
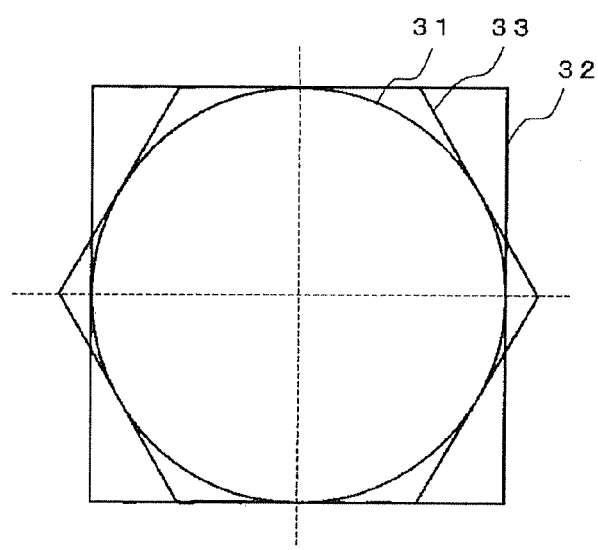
FIG. 11 is an explanatory chart showing, on a phase plane, a range necessary for a circuit operation, the range being determined by taking an area in which signals exists into consideration.

FIG. 11 shows, on a phase plane, a range necessary for a circuit operation, which is determined by taking an area in which signals exist into consideration. In the AD converter described above, the circuit is designed so that signals existing on the phase plane are included within a range having a hexagonal extension, whereby a higher advantage in circuit operation can be obtained than in a case where the signals are included within a range having a quadrangular extension (that is, ordinary 2-phase processing). Specifically, as shown in FIG. 11, if signals exist within a circular range 31 on the phase plane, in a hexagonal range 33 and a quadrangular range 32 both covering the range 31, the former has a smaller area outside the range 31 than the latter. Therefore, the passage of excessive bias current is less necessary in the former case, which realizes power saving.

Figure 12:
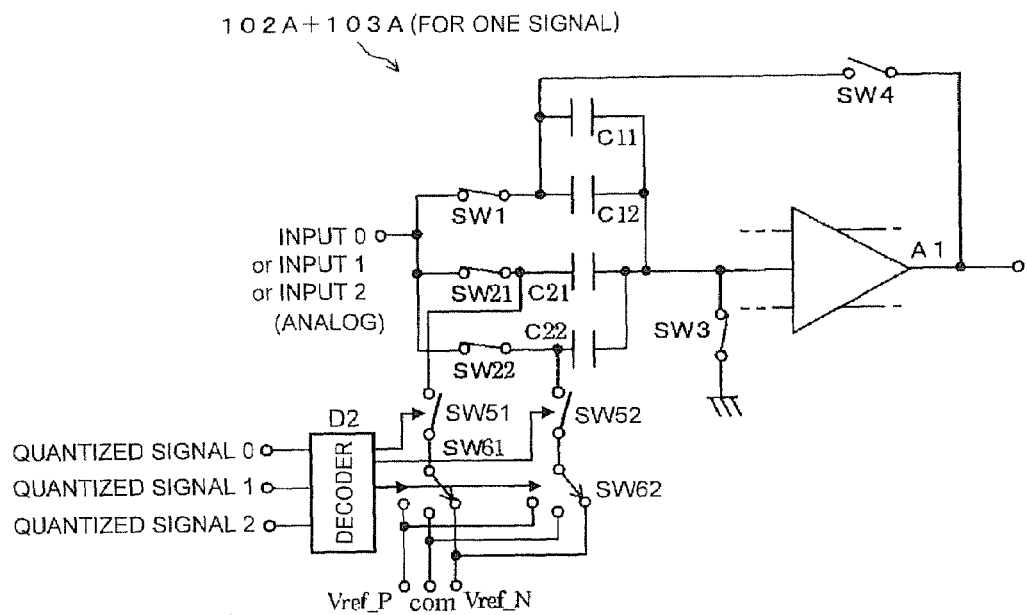
FIG. 12 is a circuit diagram showing another concrete example of the decoding part and the residual amplifying part shown in FIG. 2.

FIG. 12 shows another concrete example of the decoding part 102 and the residual amplifying part 103 shown in FIG. 2 (a circuit corresponding to one signal is shown as in FIG. 9). As shown in FIG. 9, if a common mode rejection ratio of the 3-input 3-output operational amplifying circuit A1 is sufficiently high, the MDAC shown in FIG. 9 suffices. But, if not, some special design is preferably devised so as to prevent the occurrence of a common mode component at a stage corresponding to the output of the decoding part 102. Therefore, as shown in FIG. 12, the capacitor C1 and the capacitor C2 are divided into capacitors C11, C12 and capacitors C21, C22 respectively, so that it is possible to generate Vref_P/2 and Vref_N/2. In a case where these ½ voltages are generated, a decoder D2 detects such a case and one of SW51, SW52 is closed according to the detection result.

The design shown in FIG. 12 makes it possible to generate decoded analog signals corresponding to "001" or "1101" in a form in which a common mode component is removed therefrom, such as (−0.5, −0.5, 1.0) or (0.5, −1.0, 0.5) (the sum of the three decoded analog signals is zero).

As described above, according to the AD converter of this embodiment, there is no need to prepare an analog ground potential with a high current driving capability, which can realize cost reduction. This is because signals to be processed are three analog signals having a common mode component and three differential components, and basically the differential components constitute the signals, which eliminates the need to prepare the analog ground potential with a high current driving capability. Further, since three analog signals are processed, the necessary number of capacitor elements is decreased to ¾ compared with a case where I and Q signals are both differential signals. Therefore, chip area is reduced, which realizes cost reduction. Further, the AD converter is basically of a pipeline type, which is suitable also for processing with a high sampling rate.

Figure 13:
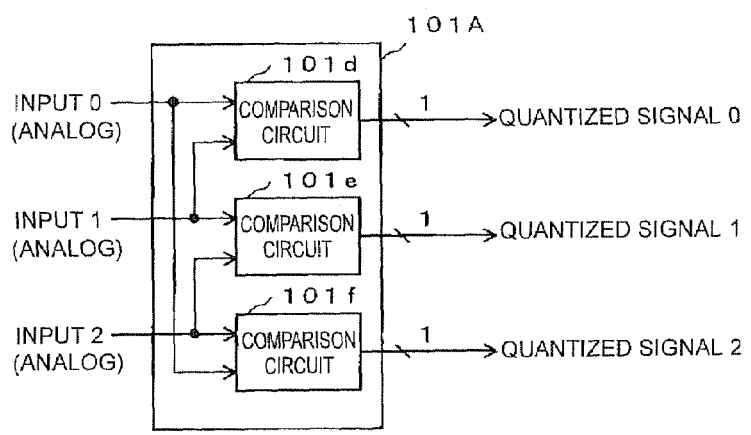
FIG. 13 is a block diagram showing another example of the internal configuration of the quantizing part shown in FIG. 2.

Next, a modification example of the above-described embodiment will be described with reference to FIG. 13 to FIG. 16. FIG. 13 shows another example of the internal configuration of the quantizing part 101 shown in FIG. 2. As shown in FIG. 13, a quantizing part 101A has three comparison circuits 101d, 101e, 101f provided in parallel. One of three analog signals is supplied to one input of each of the comparison circuits 101d, 101e, 101f, and another of the three analog signals is supplied to the other input. Input pairs are different depending on the respective comparison circuits 101d, 101e, 101f.

According to the magnitude relation between the inputted analog signals, a 1-bit quantized signal is obtained at an output of each of the comparison circuits 101d, 101e, 101f. Concretely, the comparison circuits 101d, 101e, 101f can have the same circuit configuration as that shown in FIG. 4. However, the reference voltage is not inputted, but instead, the analog signals are supplied also to the other inputs. That is, the quantizing part 101A does not require the supply of the reference voltage which is necessary in the quantizing part 101 shown in FIG. 3. Therefore, the circuit can be simplified, so that an AD converter with a smaller chip area is realized.

Figure 14:
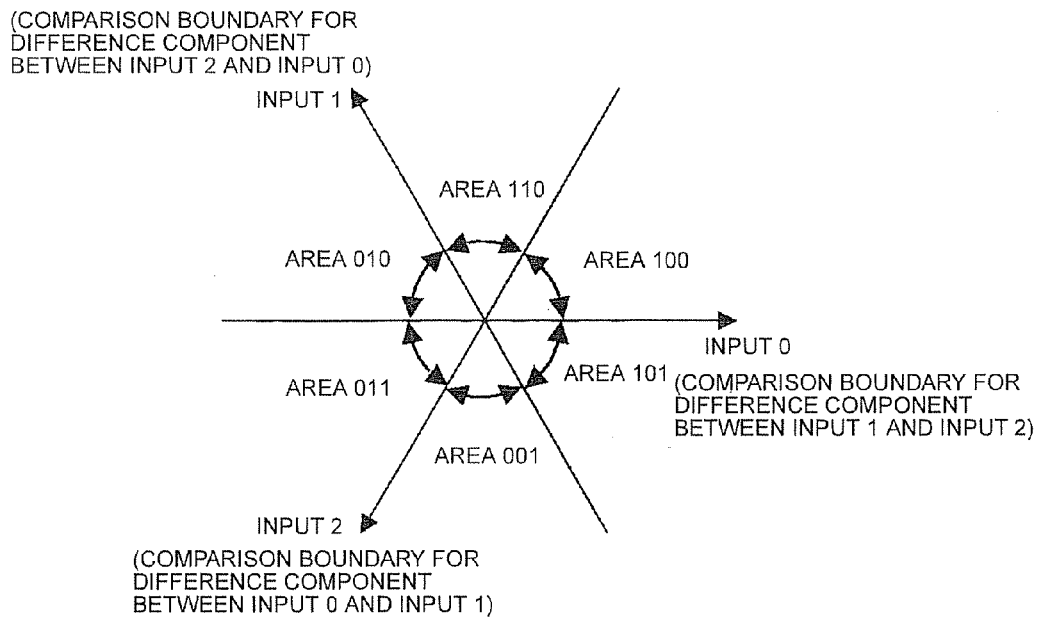
FIG. 14 is a phase plane view for explaining the operation of the quantizing part shown in FIG. 13 (ideal case).
Figure 15:
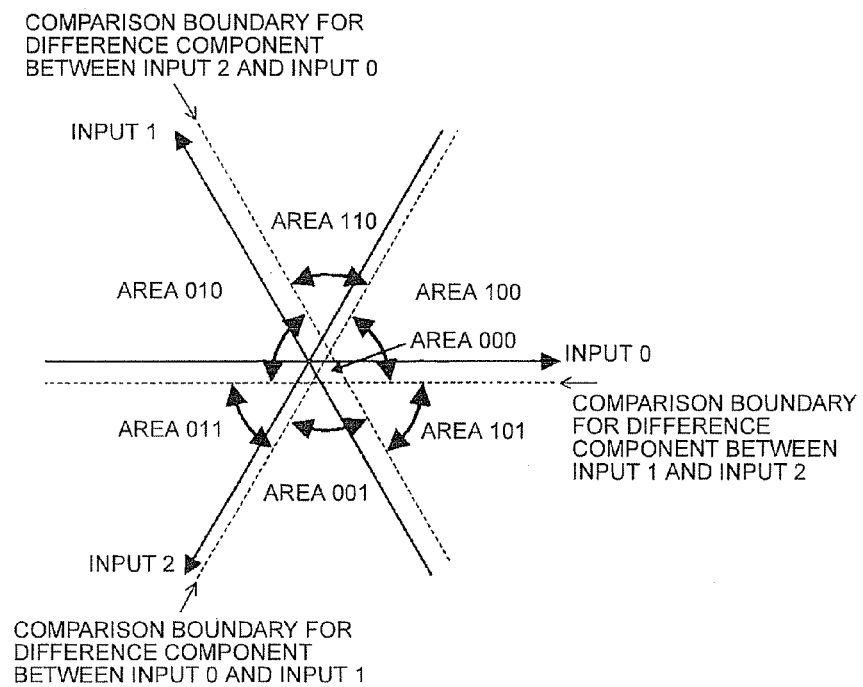
FIG. 15 is a phase plane view for explaining the operation of the quantizing part shown in FIG. 13 (actual case).

FIG. 14 shows, on a phase plane, the operation of the quantizing part 101A shown in FIG. 13 (ideal case). The quantizing part 101A shown in FIG. 13 quantizes each of difference components among the three analog signals to 1-bit information, and therefore without any error in the comparison circuits 101d, 101e, 101f, boundaries of areas and axes of the three analog signals match each other as shown in FIG. 14. With some error in the comparison circuits 101d, 101e, 101f, an area corresponding to "111" or "000" exists as shown in FIG. 15.

Figure 16:
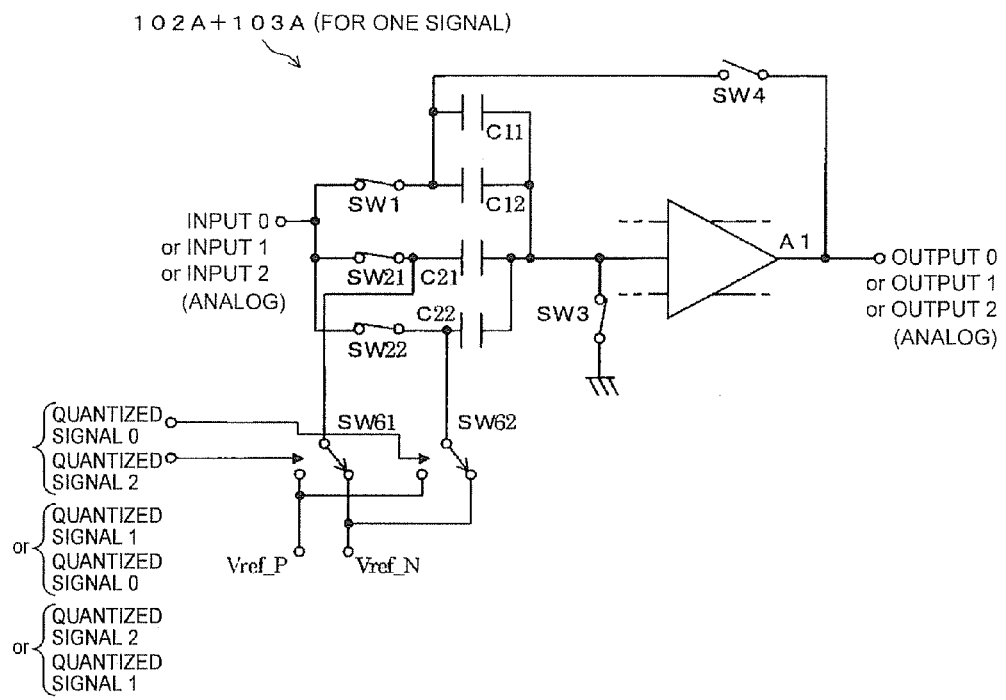
FIG. 16 is a circuit diagram showing still another concrete example of the decoding part and the residual amplifying part shown in FIG. 2.

FIG. 16 shows a concrete example of a decoding part 102A and a residual amplifying part 103A which are adapted to the quantizing part 101A shown in FIG. 13. To simplify the description, only a circuit corresponding to one signal is shown. This circuit as a whole is an MDAC similarly to the circuits shown in FIG. 9 and FIG. 12. Here, the same reference numerals and symbols are used to designate the same constituent elements as those shown in FIG. 9 and FIG. 12. A description thereof will be omitted. As shown in FIG. 16, in this circuit, the intermediate voltage "com" between Vref_P and Vref_N which is necessary in the circuit shown in FIG. 12 is not required. Further, as a signal that controls switches SW61, SW62, output signals of the comparison circuits 101d, 101d, 101f can be directly utilized without any intervention of the decoder D2. Further, SW51 and SW52 are not necessary.

When "111" signals are inputted to this MDAC, one of SW61 and SW62 is connected to Vref_P and the other is connected to Vref_N, so that the inputted signals cause cancellation. Therefore, the resultant state is the same as the state where a capacitor C21 and a capacitor C22 are connected to the intermediate voltage com in FIG. 12. When "000" signals are inputted, voltages to which the capacitor C21 and the capacitor 22 in FIG. 16 are connected are reversed from those in the case of the "111", and as a result, the inputted signals cause cancellation. Therefore, without using the decoder D2, "111" and "000" are decoded as signals corresponding to "0". Because the decoder D2 is not required, it is possible not only to simplify the circuit but also to realize a circuit suitable for higher-speed operation.

In the above description, inputs of the AD converters are the three analog signals representing the two-dimensional vectors. However, it should be noted that the description also applies to a general case where m pieces of analog signals representing n-dimensional vectors (n<m<2n) are AD-converted. Further, the quantizing part 101 is capable of outputting not only 1-bit quantized signals but also signals with 2-bits or more. In this case, the value of the constant multiplier of the residual amplifying part is changed according to the number of bits. For example, in a case of 2 bits, the constant multiplier is set to four.

Figure 17:
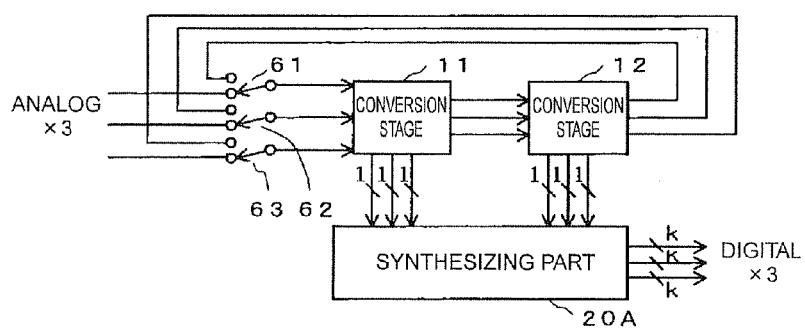
FIG. 17 is a block diagram showing the configuration of an AD converter according to another embodiment.

Next, another embodiment will be described with reference to FIG. 17. FIG. 17 shows the configuration of an AD converter according to another embodiment. In FIG. 17, the same reference numerals and symbols are used to designate the same constituent elements as those shown in FIG. 1. This AD converter has conversion stages 11, 12, a synthesizing part 20A, and switches 61, 62, 63.

The switches 61, 62, 63 are provided on a stage before three analog input signals are inputted to the conversion stage 11. To the other input terminals of the switches 61, 62, 63, output analog signals from the conversion stage 12 are supplied respectively (this realizes cyclic connection of the conversion stages 11, 12). The synthesizing part 20A synthesizes each of the three quantized signals from the conversion stage 11 and each of the three quantized signals from the conversion stages 12 at each parallel position, taking a delay amount depending on the position in the cascaded connection and the position in the cyclic connection of the conversion stages 11, 12 into consideration, thereby generating three digital signals.

With the above-described configuration, this AD converter is a so-called cyclic AD converter. However, it is a unique feature that three analog signals are inputted and accordingly three digital signals are outputted. This AD converter operates in such a manner that the switches 61, 62, 63 at first guide the three analog signals being input signals to the conversion stage 11, the conversion stages 11, 12 operate, the positions of the switches 61, 62, 63 are changed so as to guide outputs of the conversion stage 12 to the conversion stage 11, then the conversion stages 11, 12 further operate, and thereafter, the same cyclic connection state is maintained until a predetermined number of bits is obtained. When the predetermined number of bits are obtained, the positions of the switches 61, 62, 63 are changed so as to guide three analog signals being input signals to the conversion stage 11 and then, the next AD conversion operation is started.

The description of the previous embodiment covers all the other operations. That is, the internal configuration of the conversion stages 11, 12 and their operations are the same as those described with reference to FIG. 2 to FIG. 12 or FIG. 13 to FIG. 16. Therefore, this embodiment does not require the preparation of the analog ground potential with a high current driving capability and accordingly can reduce cost. Further, since three analog signals are processed, the necessary number of capacitor elements is decreased to ¾compared with a case where I and Q signals are both differential signals. Therefore, chip area is reduced, which realizes cost reduction. Compared with the above-described embodiment (FIG. 1), this circuit can reduce cost because of its smaller circuit scale, but is lower in the sampling rate of the AD conversion because of the cyclic operation of the conversion stages 11, 12. This embodiment is also applicable to a general case where m pieces of analog signals representing n-dimensional vectors (n<m<2n) are AD-converted.

Figure 18:
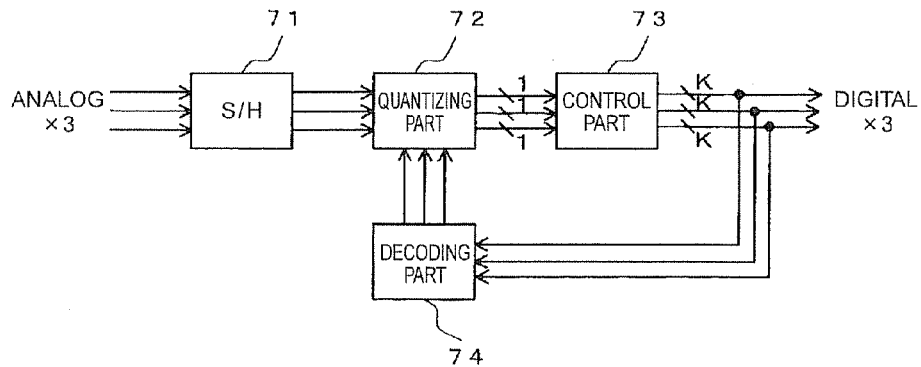
FIG. 18 is a block diagram showing the configuration of an AD converter according to still another embodiment.

Next, still another embodiment will be described with reference to FIG. 18. FIG. 18 shows the configuration of an AD converter according to still another embodiment. As shown in FIG. 18, this AD converter has a sample-and-hold part 71, a quantizing part 72, a control part 73, and a decoding part 74.

The sample-and-hold part 71 samples and holds three input analog signals according to the sampling rate of the AD conversion, and guides the held signals to the quantizing part 72. The quantizing part 72 compares each of the three held analog signals and each of three decoded analog signals from the decoding part 74 respectively and generates three parallel 1-bit quantized signals. The generated 1-bit quantized signals are guided to the control part 73. The control part 73 decides $(k+1)^{th}$ bit of each of three K-bit codes respectively based on respective values of the three parallel 1-bit quantized signals ($1 \leq k+1 \leq K$), and outputs three parallel K-bit digital values in each of which bits up to a $(k+1)^{th}$ bit have been decided and a $(k+2)^{th}$ bit and thereafter are given tentative values. The three parallel K-bit digital values which are outputted are guided to the decoding part 74.

The decoding part 74 decodes each of the three parallel K-bit digital values to generate three decoded analog signals. The control part 73 further causes the decoding part 74 and the quantizing part 72 to operate in respective states where k is changed from 0 to K−1, and outputs, as three parallel K-bit digital signals, three parallel K-bit digital values in each of which bits up to a $K^{th}$ bit have been decided. The three parallel K-bit digital signals become AD-converted outputs at one sampling timing. This AD converter is of a so-called successive approximation type. However, it is a unique feature that three analog signals are inputted and three digital signals are outputted accordingly.

To summarize the above description, the quantizing part 72 performs the 1-bit quantization based on the result of the comparison between the outputs of the sample-and-hold part 71 and the outputs of the decoding part 74, and the output digital codes of the control part 73 are rewritten based on the values resulting from the quantization. The output digital codes of the control part 73 are inputted to the decoding part 74 and utilized for the next comparison.

Figure 19:
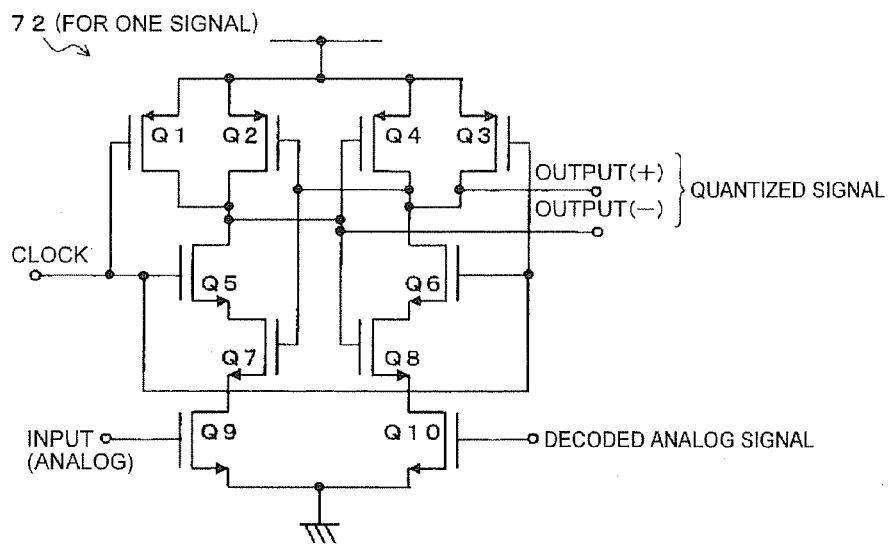
FIG. 19 is a circuit diagram showing a concrete example of a quantizing part shown in FIG. 18.

FIG. 19 shows a concrete example of the quantizing part 72 shown in FIG. 18. To simplify the description, a circuit only for one signal is shown. This circuit has the same configuration as that of the comparison circuit shown in FIG. 4. That is, this circuit is constituted of FETs Q1 to Q10, and a clock is supplied to a clock input terminal in FIG. 19 to give the output timing of the quantized signal. The decoded analog signal is supplied to a gate of Q10.

Figure 20:
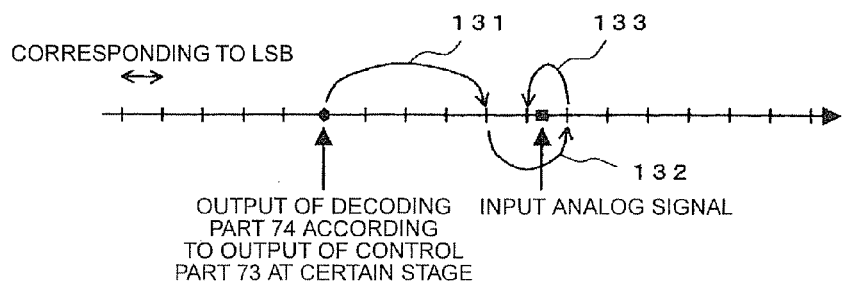
FIG. 20 is an explanatory chart showing, on a number line, the operation of a control part shown in FIG. 18.

It is premised in the operation of the 3-input AD converter shown in FIG. 18 that ordinary scalar input is AD-converted, which will be described with reference to FIG. 20. FIG. 20 shows, on a number line, the operation of the control part 73 shown in FIG. 18 and is to explain the operation of an ordinary successive approximation type AD converter. A black square represents an input analog signal and a black circle represents an output of the decoding part 74 according to an output of the control part 73 at a certain stage. In this comparison result, since the input analog signal is larger, the output of the control part 73 is corrected so that the output of the decoding part 74 is increased as shown by the arrow 131.

In the next comparison, since the input analog signal is still larger than the output of the decoding part 74 as shown in FIG. 20, the output of the control part 73 is corrected so that the output of the decoding part 74 is increased as shown by the arrow 132. Further, in the next comparison, since the input analog signal is smaller this time, the output of the control part 73 is corrected/rewritten so that the output of the decoding part 74 is decreased as shown by the arrow 133. This algorithm is also called dichotomizing search.

Figure 8:
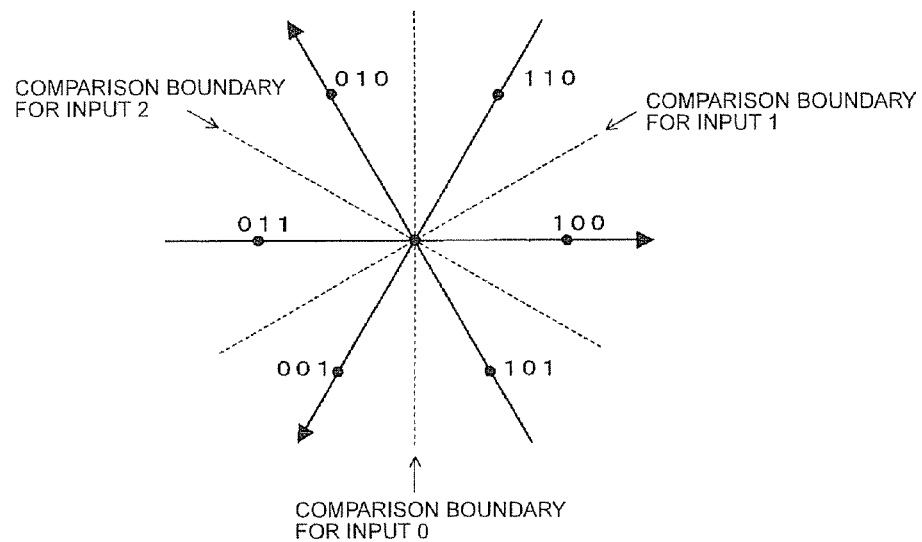
FIG. 8 is an explanatory chart showing, on a phase plane, the operation of the quantizing part shown in FIG. 3.
Figure 21:
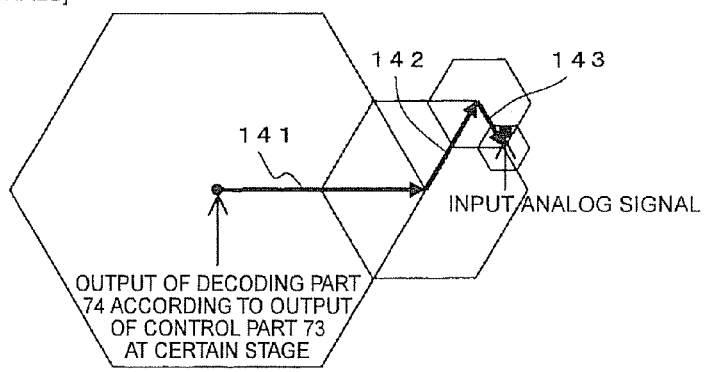
FIG. 21 is an explanatory chart showing, on a phase plane, the operation of the control part shown in FIG. 18.

FIG. 21 shows, on the phase plane, the operation of the control part 73 shown in FIG. 18. A black square represents input analog signals and a black circle represents outputs of the decoding part 74 according to outputs of the control part 73 at a certain stage. As shown in FIG. 21, this 3-input AD converter can detect the direction of residual vectors instead of the simple magnitude of each scalar in outputs of the quantizing part 72. That is, when the outputs of the quantizing part 72 are, for example, "100", it is determined that the input analog signals (vectors) are in a right 60° fan-shaped area on the phase plane (FIG. 8 can be also referred to). Consequently, the outputs of the control part 73 are corrected so that the outputs (vector) of the decoding part 74 are corrected as shown by the arrow 141.

Next, residual vector between the corrected decoded vector and the input analog vector is quantized in the quantizing part 72, whereby the residual vector can be found as "110". Consequently, the control part 73 corrects digital codes of its outputs as shown by the arrow 142. Next, further correction is repeated so as to gradually reduce difference between the input vector and the decoded vector as shown by the arrow 143, whereby the most approximate decoded vector and corresponding digital codes can be decided.

Incidentally, when values of all the outputs of the quantizing part 72 become equal (all are 0 or all are 1), the control part 73 makes no further correction of the output codes. This is because, it can be considered that the digital signals corresponding to the three input analog signals can be obtained in the outputs of the control part 73 at this instant (this can be seen by referring to FIG. 8). In this respect, the AD converter circuit shown in FIG. 18 is different from a circuit where three AD converter circuits for scalar are simply arranged in parallel.

Also in this embodiment, it is not necessary to prepare the analog ground potential with a high current driving capability, which can realize cost reduction. Further, since three analog signals are processed, the necessary number of capacitor elements is decreased to ¾ compared with a case where I and Q signals are both differential signals. Therefore, chip area is reduced, which realizes cost reduction. Further, compared with the aforesaid pipeline AD converter (FIG. 1), this circuit has a smaller circuit scale, resulting in cost reduction. Further, compared with the cyclic AD converter (FIG. 17), this circuit requires lower power consumption since the amplifying operation is not required. However, compared with the pipeline AD converter, this circuit is lower in sampling rate due to the successive approximation. It should be noted that this embodiment is also applicable to a general case where m pieces of analog signals representing n-dimensional vectors (n <m<2n) are AD-converted.

Figure 22:
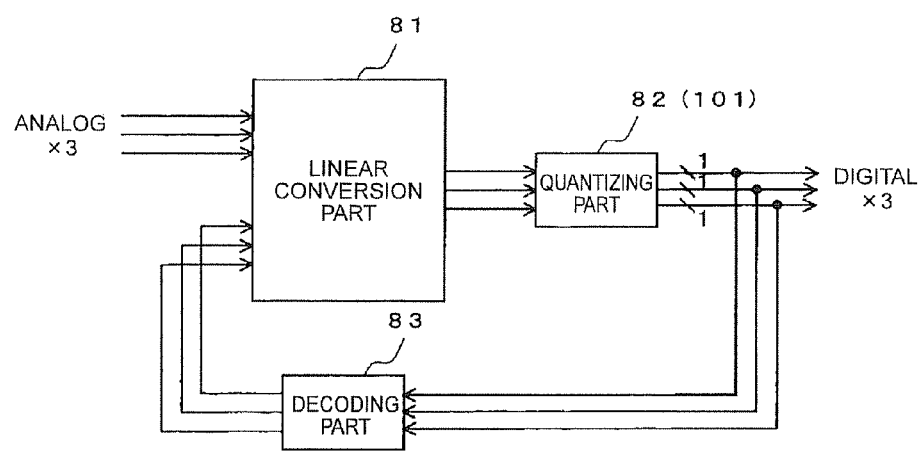
FIG. 22 is a block diagram showing the configuration of an AD converter according to yet another (fourth) embodiment.

Next, an AD converter according to yet another (fourth) embodiment will be described with reference to FIG. 22. FIG. 22 shows the configuration of the AD converter according to yet another (fourth) embodiment. As shown in FIG. 22, this AD converter has a linear conversion part 81, a quantizing part 82, and a decoding part 83.

The linear conversion part 81 linearly converts respective differences between each of three analog signals, which are inputs to be AD-converted, and each of three decoded analog signals from the decoding part 83 to output three linearly converted analog signals. The linearly converted analog signals are supplied to the quantizing part 82. The quantizing part 82 quantizes each of the three linearly converted analog signals to generate three parallel 1-bit quantized signals as three parallel digital signals. The decoding part 83 decodes each of the three parallel digital signals to generate three decoded analog signals. The three decoded analog signals are guided to the linear conversion part 81.

With the above-described configuration, this AD converter is a so-called delta-sigma AD converter. However, it is a unique feature that three analog signals are inputted and three digital signals are accordingly outputted. The quantizing part 82 can have the same configuration as that of the quantizing part 101 shown in FIG. 3. Therefore, concrete examples of comparison circuits 101*a* etc. which are internal components thereof are the same as those shown in FIG. 4 and FIG. 5.

The linear conversion part 81 will be further described. Inputs of the linear conversion part 81 are the respective differences between each of the three analog signals, which are the inputs to be AD-converted, and each of the three decoded analog signals from the decoding part 83, and a transmission characteristic from its input to output is a linear transmission characteristic having a certain frequency characteristic. Owing to this frequency characteristic of the linear conversion part 81, it is possible to control frequency distribution of quantization noise. Therefore, high-accuracy AD conversion is possible by using the quantizing part 82 with rough resolution, if a frequency range is narrow. In these respects, this AD converter is the same as a conventional delta-sigma AD converter that AD-converts scalar signal.

Figure 23:
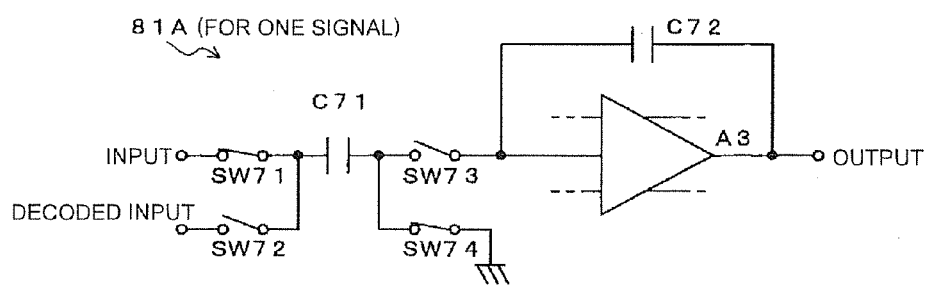
FIG. 23 is a circuit diagram showing a concrete example of a linear conversion part shown in FIG. 22.

FIG. 23 shows a concrete example of the linear conversion part 81 shown in FIG. 22. To simplify the description, a circuit for one signal is shown. This linear conversion part 81A uses a switched capacitor integrator. In the state of switches shown in FIG. 23, charges corresponding to an analog input signal are accumulated in a sampling capacitor C71. Next, when the states of the switches are reversed, the charges accumulated in the sampling capacitor C71 are transferred to an integrating capacitor 72, which then performs an integration operation by adding the transferred charges and charges that have been accumulated up to the last time.

At this time, an analog signal decoded by the decoding part 83 is applied to the sampling capacitor C71, and charges corresponding to the decoded analog signal are absorbed out of the integrating capacitor C72. As a result, charges corresponding to a difference between the analog input signal and the decoded analog signal are accumulated in the integrating capacitor C72. Incidentally, as an operational amplifying circuit A3, it is preferable to use the 3-input 3-output operational amplifying circuit A1 as shown in FIG. 9 (concrete circuit example is shown in FIG. 10) for the purpose of common mode rejection.

The input/output relation in the linear conversion part 81A shown in FIG. 23 is expressed by the following equation, where x is an analog input signal, v is a decoded analog signal, y is an output of the linear conversion part 81A, Cs is a capacitance value of the sampling capacitor C71, and CI is a capacitance value of the integrating capacitor C72.

$$y = \frac{C_s}{C_I(1-z^{-1})}(x-v) \quad (1)$$

The input/output relation of the whole 6 inputs and 3 outputs is expressed by the following equation, $$\begin{bmatrix} y_0 \\ y_1 \\ y_2 \end{bmatrix} = \begin{bmatrix} D & 0 & 0 & -D & 0 & 0 \\ 0 & D & 0 & 0 & -D & 0 \\ 0 & 0 & D & 0 & 0 & -D \end{bmatrix} \begin{bmatrix} x_0 \\ x_1 \\ x_2 \\ v_0 \\ v_1 \\ v_2 \end{bmatrix} \text{ where} \quad (2)$$

$$D = \frac{C_s}{C_I(1-z^{-1})} \quad (3)$$

FIG. 23 shows the case where the linear conversion part 81 uses the switched capacitor integrator as its component, but it is well known that a switched capacitor filter can realize not only a low-pass characteristic such as that of an integrator but also a band-pass characteristic and a high-pass characteristic. Further, since many prototypes using a high-order filter in ordinary delta-sigma AD converters for scalar signal have been reported, any of these high-order filters can be extended for use in this embodiment.

Figure 24:
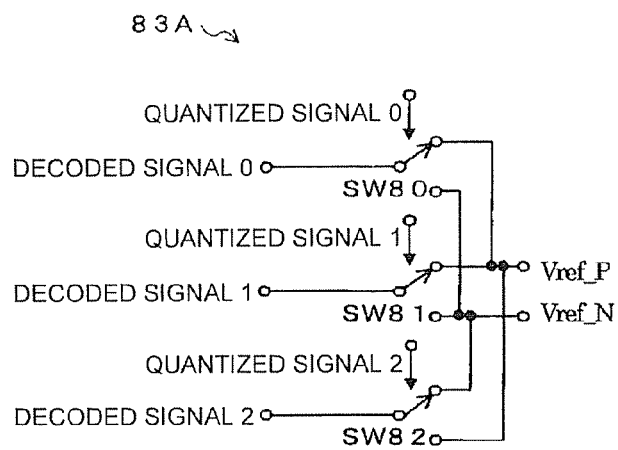
FIG. 24 is a circuit diagram showing a concrete example of a decoding part shown in FIG. 22.

It is also possible to use the quantizing part 101A shown in FIG. 13 as the quantizing part 82. As the decoding part 83 adapted to this case, usable is a decoding part 83A structured by a simple switch circuit as shown in FIG. 24. Three decoded signal shave either a positive reference voltage Vref_P or a negative reference voltage Vref_N according to the selection by the switches SW80, SW81, SW82. To control the switches SW80, SW81, SW82, quantized signals can be utilized as they are. That is, a decoder converting the quantized signals to signals for controlling the switches SW80, SW81, SW82 is not required. Therefore, this circuit not only is suitable for high-speed operation but also can have a smaller circuit scale, which accordingly can reduce chip area and power consumption.

Figure 25:
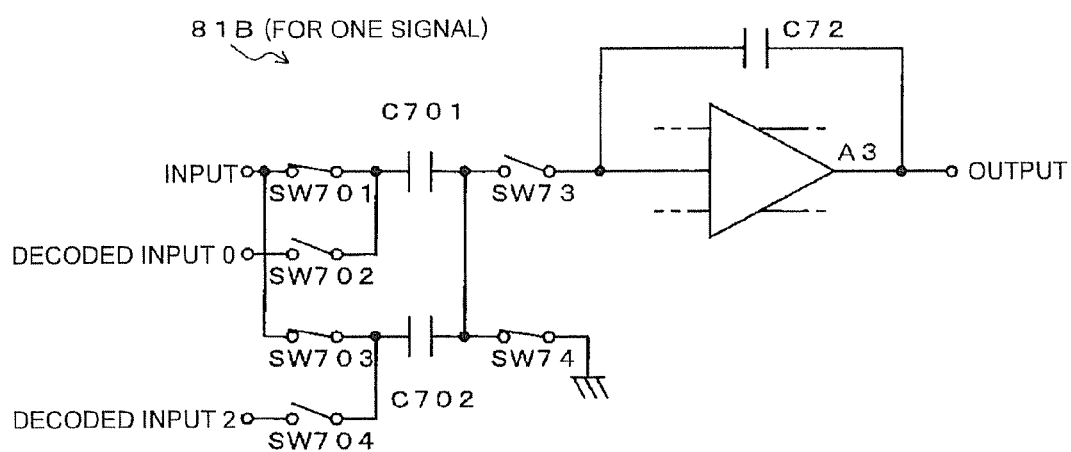
FIG. 25 is a circuit diagram showing another concrete example of the linear conversion part shown in FIG. 22.

FIG. 25 shows a concrete example of the linear conversion part 81 adapted to the quantizing part 101A shown in FIG. 13 and the decoding part 83A shown in FIG. 24. Here, to simplify the description, a circuit for one signal is shown. Similarly to the linear conversion circuit 81A shown in FIG. 23, this linear conversion part 81B uses a switched capacitor integrator. In the states of switches shown in FIG. 25, charges corresponding to an analog input signal are accumulated in sampling capacitors C701, C702.

Next, when the states of the switches are reversed, the charges accumulated in the sampling capacitors C701, C702 are transferred to an integrating capacitor C72, which then performs an integration operation by adding the transferred charges and charges that have been accumulated up to the last time. At this time, an analog signal resulting from the decoding by the decoding part 83A are applied to the sampling capacitors C701, C702, and charges corresponding to the decoded analog signals are absorbed out of the integrating capacitor 72. As a result, charges corresponding to a difference between the analog input and the decoded analog signals are accumulated in the integrating capacitor C72. Incidentally, as an operational amplifying circuit A3, it is preferable to use the 3-input 3-output operational amplifying circuit A1 (FIG. 10) for the purpose of common mode rejection.

Figure 26:
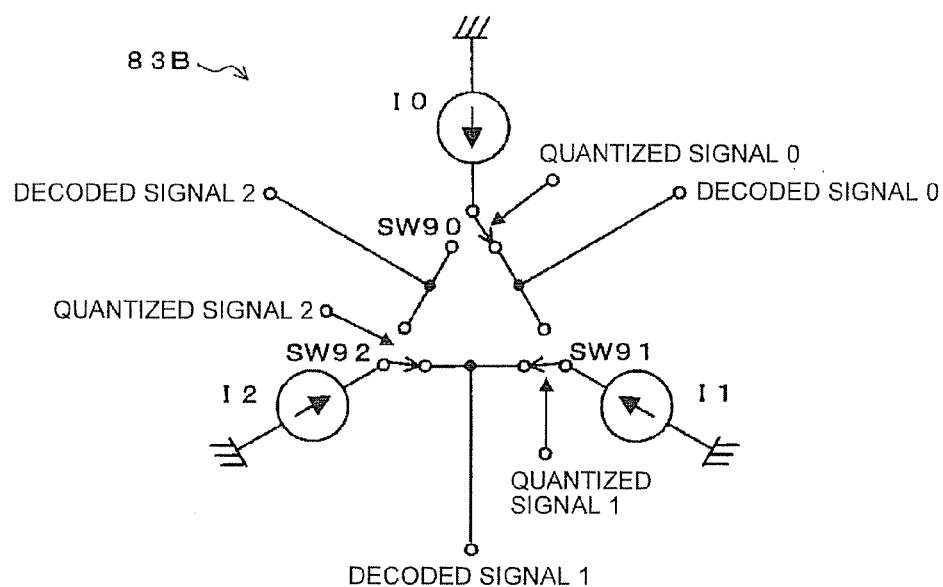
FIG. 26 is a circuit diagram showing another concrete example of the decoding part shown in FIG. 22.

FIG. 26 shows a decoding part 83B using a reference current, which is used in place of the decoding part 83A using a reference voltage shown in FIG. 24. A quantizing part adapted to this case also has the structure shown in FIG. 13. The decoding part 83B in this case has a simple structure, and in this respect, the decoding part 83B is the same as the decoding part 83A using the reference voltage shown in FIG. 24. In FIG. 26, output destinations of three reference currents are selected according to quantized signals 0, 1, 2. Decoded signals are outputted as current signals respectively.

In this decoding part 83B, since the quantized signals are usable as they are for controlling switches SW90, SW91, SW92, no decoder converting the quantized signals to signals controlling the switches SW90, SW91, SW92 is required. Therefore, this circuit not only is suitable for high-speed operation but also can have a smaller circuit scale, which can accordingly reduce chip area and power consumption.

Figure 27:
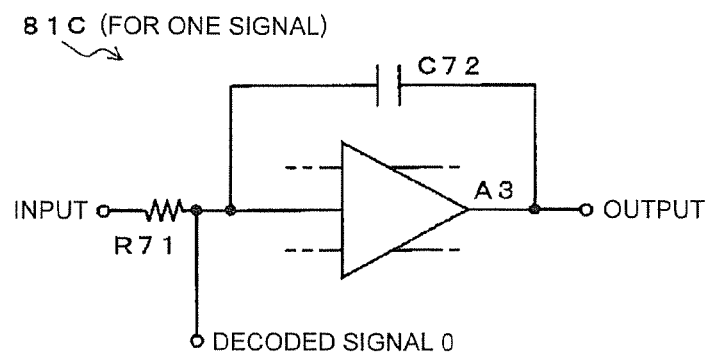
FIG. 27 is a circuit diagram showing still another concrete example of the linear conversion part shown in FIG. 22.

FIG. 27 shows a concrete example of the linear conversion part 81 that is used in combination with the decoding part 83B shown in FIG. 26. To simplify the description, a circuit for one signal is shown. This linear conversion part 81C is a continuous-time integrator (RC integrator). A voltage input signal is converted to a current by a resistor R71 and is synthesized with a current decoded signal supplied from the current-type decoding part 83B. In a normal operation range, the input signal and a decoded component are cancelled by each other, and only an error component is accumulated in an integrating capacitor C72. If the AD converter is of a current input type, the resistor R71 can be also omitted. Incidentally, as an operational amplifying circuit A3, it is preferable to use the 3-input 3-output operational amplifying circuit A1 (FIG. 10) for the purpose of common mode rejection.

Figure 28:
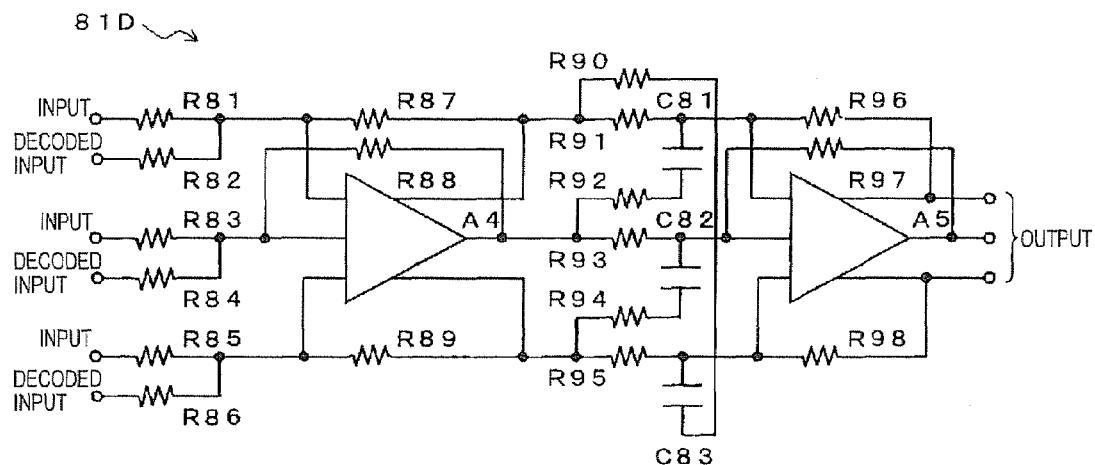
FIG. 28 is a circuit diagram showing yet another concrete example of the linear conversion part shown in FIG. 22.

Next, FIG. 28 shows yet another concrete example of the linear conversion part 81 shown in FIG. 22. This linear conversion part 81D has, as its components, resistors R81 to R98, capacitors C81 to C82, and 3-input 3-output operational amplifying circuits A4, A5 (as concrete examples thereof, that shown in FIG. 10 can be used). With this structure, RC filters exist inside as shown in FIG. 28. Therefore, there are RC signal paths in paths of 3-phase signals, and an equation having a specific frequency characteristic also appears in elements that are 0 in the matrix in the equation 2 (elements representing mutual coupling of the 3-phase signals). The AD converter circuit of this embodiment can be also realized in such a case.

Also in the embodiment shown in FIG. 22, there is no need to prepare the analog ground potential having a high current driving capability, which realizes cost reduction. Further, since three analog signals are processed, the necessary number of capacitor elements is decreased to ¾ compared with a case where I and Q signals are both differential signals. Therefore, chip area is reduced, which realizes cost reduction. Further, compared with the aforesaid pipeline AD converter, this circuit has a smaller circuit scale, resulting in cost reduction. It should be noted that this embodiment is also applicable to a general case where m pieces of analog signals representing n-dimensional vectors (n<m<2n) are AD-converted.

Figure 29:
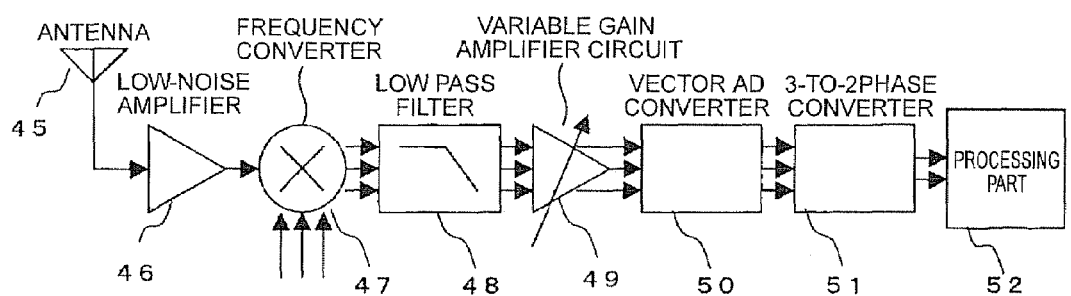
FIG. 29 is a block diagram showing the configuration of a radio receiver using any of the AD converters shown in FIG. 1, FIG. 17, FIG. 18, and FIG. 22.

Next, an embodiment of a radio receiver to which any of the above-described AD converters is applied will be described with reference to FIG. 29. FIG. 29 shows the configuration of a radio receiver using the AD converter shown in FIG. 1, FIG. 17, FIG. 18, or FIG. 22. As shown in FIG. 29, this radio receiver has an antenna 45, a low-noise amplifier 46, a frequency converter 47, a low pass filter 48, a variable gain amplifying circuit 49, a vector AD converter 50, a 3-to-2 phase converter 51, and a processing part 42. The vector AD converter 50 is any of the AD converters described above.

The operation of this radio receiver will be described. Signals carried by a carrier wave are converted to electric signals by the antenna 45, and after amplified by the low-noise amplifier 46, are converted to 3-phase baseband signals by the frequency converter circuit (down converter) 47. Demodulation axes of the frequency converter circuit 47 are three axes intersecting at an origin at 120° angle on an IQ phase plane. Outputs of the frequency converter circuit 47, after an unnecessary signal (harmonic content) is removed therefrom by a 3-phase filter, are amplified by the variable gain amplifying circuit 49 to have amplitudes suitable for inputs of the AD converter 50.

Outputs of the AD converter 50 are digital signals but are 3-phase signals (three parallel digital signals) as described above. In subsequent processes, digital signal processing often handles the outputs as two components of a real part and an imaginary part, and hence, the 3-to-2 phase converter 51 converts the 3-phase signals to 2-phase signals, which are thereafter supplied to the processing part 52. The processing part 52 processes the two digital signals in a predetermined manner.

By such a configuration of the radio receiver, baseband analog parts are unified to 3-phase signal processing circuits. The 3-phase signal processing circuit does not require a buffer amplifier for analog ground which is needed in the single-ended circuit and is thus suitable for reducing power consumption, and is capable of amplifying a complex signal such as an I signal and a Q signal yet requires a less number of circuit elements than an ordinary differential circuit. Therefore, an occupying area of the 3-phase signal processing circuits on a semiconductor chip can be reduced. This effect becomes the largest when the baseband analog parts of the receiver are unified to the 3-phase signal processing circuits, which accordingly enables cost reduction in manufacture of an integrated circuit. Further, since the conversion to orthogonal signals from 3-phase signals can be performed in digital parts, it is possible to obtain an advantage that an influence of an analog error can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An AD converter, comprising:

a first conversion stage, to which m pieces of input analog signals representing n-dimensional vectors (n<m<2n) can be inputted, including a converting section having a quantizing part configured to generate m parallel pieces of quantized signals from m pieces of analog signals, a decoding part configured to generate m pieces of decoded analog signals from the m parallel pieces of quantized signals, and a residual amplifying part configured to output m pieces of amplified residual signals by multiplying respective differences between each of the m pieces of analog signals and each of the m pieces of decoded analog signals by a constant multiplier, wherein the m pieces of input analog signals inputted to the first conversion stage serve as the m pieces of analog signals in the quantizing part;

a second conversion stage including a converting section having a quantizing part configured to generate m parallel pieces of quantized signals from the m pieces of amplified residual signals; and a synthesizing part configured to generate m parallel pieces of digital signals by synthesizing each of the quantized signals in the first conversion stage and each of the quantized signals in the second conversion stage at each parallel position by delaying the quantized signals in the first-conversion stage by a delay amount of the quantized signals in the second conversion stage relative to the quantized signals in the first conversion stage.

2. The AD converter according to claim 1, wherein the converting section in the second conversion stage further includes a decoding part configured to generate m pieces of decoded analog signals from the m parallel pieces of quantized signals in the second conversion stage, and a residual amplifying part configured to output m pieces of amplified residual signals by multiplying respective differences between each of the m pieces of amplified residual signals in the first conversion stage and each of the m pieces of decoded analog signals in the second conversion stage by a constant multiplier; and further comprising a switch capable of guiding the m pieces of amplified residual signals in the second conversion stage to the first conversion stage instead of the m pieces of input analog signals.

3. The AD converter according to claim 1, wherein the n is 2, the m is 3, each of three parallel quantized signals generated by the quantizing part in the first conversion stage consists of 1-bit, each of three parallel quantized signals generated by the quantizing part in the second conversion stage consists of 1-bit, and the constant multiplier of the residual amplifying part is substantially two.

4. The AD converter according to claim 3, wherein each of the first and second conversion stages is configured so as to generate three parallel 1-bit quantized signals in each of the quantizing parts therein by comparing each of three analog signals with a reference voltage, and so as to generate each of the reference voltages in the quantizing parts therein substantially by averaging the three analog signals.

5. The AD converter according to claim 3, wherein each of the first and second conversion stages is configured to generate three parallel 1-bit quantized signals in each of the quantizing parts therein by comparing two analog signals in each of three different pairs each consisting of two of the three analog signals.

6. The AD converter according to claim 3, wherein the decoding part and the residual amplifying part are constituted by three MDACs, and the residual amplifying part being part of each of the three MDACs has a 3-input 3-output operational amplifying circuit common to the three MDACs and having a common mode rejection function.

7. The AD converter according to claim 3,
wherein the decoding part in the first conversion stage is configured to generate three signals each having a value between two analog values each corresponding to respective binaries of the three parallel 1-bit quantized signals, as the three decoded analog signals, when the three parallel 1-bit quantized signals all have equal values.

8. The AD converter according to claim 3,
wherein the decoding part in the first conversion stage is configured to generate, as the three decoded analog signals, three analog signals from which a common mode component is removed.

9. A radio receiver, comprising:
a frequency converter configured to generate three analog signals as baseband signals representing two-dimensional vectors by down-converting a carrier wave modulated by signals representing the two-dimensional vectors;
an AD converter including:
  a first conversion stage including a quantizing part configured to generate three parallel quantized signals from the three analog signals, a decoding part configured to generate three decoded analog signals from the three parallel quantized signals, and a residual amplifying part configured to output three amplified residual signals by multiplying respective differences between each of the three analog signals and each of the three decoded analog signals by a constant multiplier;
  a second conversion stage including a quantizing part configured to generate three parallel quantized signals from the three amplified residual signals; and
  a synthesizing part configured to generate three parallel digital signals by synthesizing each of the quantized signals in the first conversion stage and each of the quantized signals in the second conversion stage at each parallel position by delaying the quantized signals in the first conversion stage by a delay amount of the quantized signals in the second conversion stage relative to the quantized signals in the first conversion stage;
a 3-to-2 phase converter configured to generate, from the three parallel digital signals, two parallel digital signals as the signals representing the two-dimensional vectors; and
a processing part configured to digitally process the two parallel digital signals.

10. An AD converter that converts m pieces of analog signals representing n-dimensional vectors (n<m<2n) to m parallel pieces of K-bit digital signals, the AD converter comprising:
a decoding part configured to generate m pieces of decoded analog signals from m parallel pieces of K-bit digital values in each piece of which bits up to a $k^{th}$ bit ($0 \leq k \leq K-1$) have been decided and a $(k+1)^{th}$ bit and thereafter are given tentative values;
a quantizing part configured to generate m parallel pieces of 1-bit quantized signals by comparing each of the m pieces of analog signals and each of the m pieces of decoded analog signals;
a first control part configured to output m parallel pieces of K-bit digital values in each piece of which bits up to a $(k+1)^{th}$ bit have been decided and a $(k+2)^{th}$ bit and thereafter are given tentative values by deciding a $(k+1)^{th}$ bit of each of m parallel pieces of K-bit digital codes based on each of values of the m parallel pieces of 1-bit quantized signals; and
a second control part configured to output m parallel pieces of K-bit digital values in each piece of which bits up to a $K^{th}$ bit have been decided, as the m parallel pieces of K-bit digital signals, by causing the decoding part, the quantizing part, and the first control part to operate in respective states where the "k" is changed from 0 to K−1.

11. The AD converter according to claim 10,
wherein the n is 2 and the m is 3.

12. The AD converter according to claim 10,
wherein the first control part is configured to further output, as the m parallel pieces of K-bit digital signals, the m parallel pieces of K-bit codes in each piece of which bits up to a $k^{th}$ bit have been decided and the $(k+1)^{th}$ bit and thereafter are given tentative values, when values of the m parallel pieces of 1-bit quantized signals are all equal.

13. A radio receiver, comprising:
a frequency converter configured to generate three analog signals as baseband signals representing two-dimensional vectors by down-converting a carrier wave modulated by signals representing the two-dimensional vectors;
an AD converter that converts the three analog signals to three parallel K-bit digital signals, comprising:
  a decoding part configured to generate three decoded analog signals from three parallel K-bit digital values in each of which bits up to a $k^{th}$ bit ($0 \leq k \leq K-1$) have been decided and a $(k+1)^{th}$ bit and thereafter are given tentative values;
  a quantizing part configured to generates three parallel 1-bit quantized signals by comparing each of the three analog signals and each of the three decoded analog signals;
  a first control part configured to output three parallel K-bit digital values in each of which bits up to a $(k+1)^{th}$ bit have been decided and a $(k+2)^{th}$ bit and thereafter are given tentative values by deciding a $(k+1)^{th}$ bit of each of three parallel K-bit digital codes based on each of values of the three parallel 1-bit quantized signals; and
  a second control part configured to output three parallel K-bit digital values in each of which bits up to a $K^{th}$ bit have been decided, as the three parallel K-bit digital signals, by causing the decoding part, the quantizing part, and the first control part to operate in respective states where the "k" is changed from 0 to K−1;
a 3-to-2 phase converter configured to generate, from the three parallel K-bit digital signals, two parallel digital signals as the signals representing the two-dimensional vectors; and
a processing part configured to digitally process the two parallel digital signals.

14. An AD converter that converts m pieces of analog signals representing n-dimensional vectors (n<m<2n) to m parallel pieces of digital signals, the AD converter comprising:
a decoding part configured to generate m pieces of decoded analog signals from the m parallel pieces of digital signals;
a linear conversion part configured to output m pieces of linearly converted analog signals by linearly converting respective differences between each of the m pieces of analog signals and each of the m pieces of decoded analog signals; and a quantizing part configured to generate m parallel pieces of 1-bit quantized signals as the m parallel pieces of digital signals from the m pieces of linearly converted analog signals.

15. The AD converter according to claim 14,
wherein the n is 2 and the m is 3.

16. The AD converter according to claim 15,
wherein the linear conversion part includes a 3-input 3-output operational amplifying circuit having a common mode rejection function and used commonly to linearly convert the respective differences between each of three analog signals and each of three decoded analog signals.

17. The AD converter according to claim 15,
wherein the quantizing part is configured so as to generate three parallel 1-bit quantized signals by comparing each of three linearly converted analog signals with a reference voltage, and so as to generate the reference voltage therein substantially by averaging of the three linearly converted analog signals.

18. The AD converter according to claim 15,
wherein the quantizing part is configured to generate three parallel 1-bit quantized signals by comparing two linearly converted analog signals in each of three different pairs each consisting of two of the three linearly converted analog signals.

19. A radio receiver, comprising:

a frequency converter configured to generate three analog signals as baseband signals representing two-dimensional vectors by down-converting a carrier wave modulated by signals representing the two-dimensional vectors;

an AD converter that converts the three analog signals representing the two-dimensional vectors to three parallel digital signals, including:
    a decoding part configured to generate three decoded analog signals from the three parallel digital signals;
    a linear conversion part configured to output three linearly converted analog signals by linearly converting respective differences between each of the three analog signals and each of the three decoded analog signals; and
    a quantizing part configured to generate three parallel 1-bit quantized signals as the three parallel digital signals from the three linearly converted analog signals;

a 3-to-2 phase converter configured to generate, from the three parallel digital signals, two parallel digital signals as the signals representing the two-dimensional vectors; and a processing part configured to digitally process the two parallel digital signals.

* * * * *